United States Patent [19]

Naito

[11] Patent Number: 5,707,779

[45] Date of Patent: Jan. 13, 1998

[54] AMORPHOUS ORGANIC THIN-FILM DEVICE, AMORPHOUS ORGANIC POLYMER COMPOSITION, AND AMORPHOUS INORGANIC COMPOSITION

[75] Inventor: Katsuyuki Naito, Yokohama, Japan

[73] Assignee: Kabushiki Kaisha Toshiba, Kawasaki, Japan

[21] Appl. No.: 701,991

[22] Filed: Aug. 23, 1996

Related U.S. Application Data

[63] Continuation of Ser. No. 281,034, Jul. 27, 1994, abandoned.

[30] Foreign Application Priority Data

Jul. 27, 1993 [JP] Japan ..................... 5-184652
Mar. 18, 1994 [JP] Japan ..................... 6-048092

[51] Int. Cl.$^6$ ..................... G03G 5/06
[52] U.S. Cl. ............ 430/270.1; 430/945; 428/690; 313/498; 313/507; 313/504
[58] Field of Search ............ 313/503, 504, 313/506, 507, 498; 346/135.1; 292/301.16, 301.35; 430/905, 270.1, 270.15; 428/690, 9 A

[56] References Cited

U.S. PATENT DOCUMENTS

| | | | |
|---|---|---|---|
| 5,281,489 | 1/1994 | Mori et al. | 428/690 |
| 5,343,050 | 8/1994 | Egusa et al. | 313/504 |
| 5,346,772 | 9/1994 | Akiyama et al. | 252/301.16 |
| 5,382,477 | 1/1995 | Saito et al. | 428/690 |
| 5,466,392 | 11/1995 | Hironaka et al. | 252/301.16 |
| 5,503,910 | 4/1996 | Matsuura et al. | 313/504 |

FOREIGN PATENT DOCUMENTS

| | | |
|---|---|---|
| 5-172072 | 6/1993 | Japan . |
| 5-202011 | 8/1993 | Japan . |

OTHER PUBLICATIONS

Bessler, et al. "Supramolecular . . . " JACS 1993 pp. 4076–4086.

Naito et al, "Molecular Design . . . " J. Phys. Chem. 97 6240–6248 (1993).

Belser, Peter, et al. "Supramolecular Ru and/or Os Complexes of Tris(bipyridine) Bridging Ligands. Synthesis, Absorption Spectra, Luminescence Properties, Electromechanical Behavior, Intercomponent Energy, and Electron Transfer"; J. Am. Chem. Soc.; 1993, 115, pp. 4076–4086.

"Photo–and Electro–active Amorphous Molecular Materials: Morphology, Structures, and Hole Transport Properties of Tri(biphenyl–4–yl)amine"; J. Mater Chem., 1994, vol. 4, pp. 171–177.

Wataru Ishikawa, et al. "Starburst Molecules for Amorphous Molecular Materials: Synethsis and Morphology Of 1,3, 5–Tris(Diphenylamino)Benzene and Its Mehtyl–Substituted Derivatives"; Mol. Cryst. Liq. Cryst., 1992, vol. 211; pp. 431–438.

*Primary Examiner*—Martin Angebranndt
*Attorney, Agent, or Firm*—Oblon, Spivak, McClelland, Maier & Neustadt, P.C.

[57] ABSTRACT

An amorphous organic thin-film device comprising an organic thin-film containing a dye molecules represented by the following formula (1) or (2):

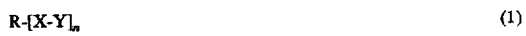

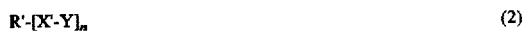

wherein R represents an aromatic skeleton, R' represents a heterocyclic aromatic skeleton, X represents a linkage group containing a chemical bond formed by a condensation reaction, X' represents a member selected from the group consisting of a single bond, —O—, —NH—, —NR"CO— and —CH$_2$—, Y represents a dye skeleton with or without a substituent; and n is an integer of 3 or more, in which n members of X, X' and Y may be the same or different.

9 Claims, 3 Drawing Sheets

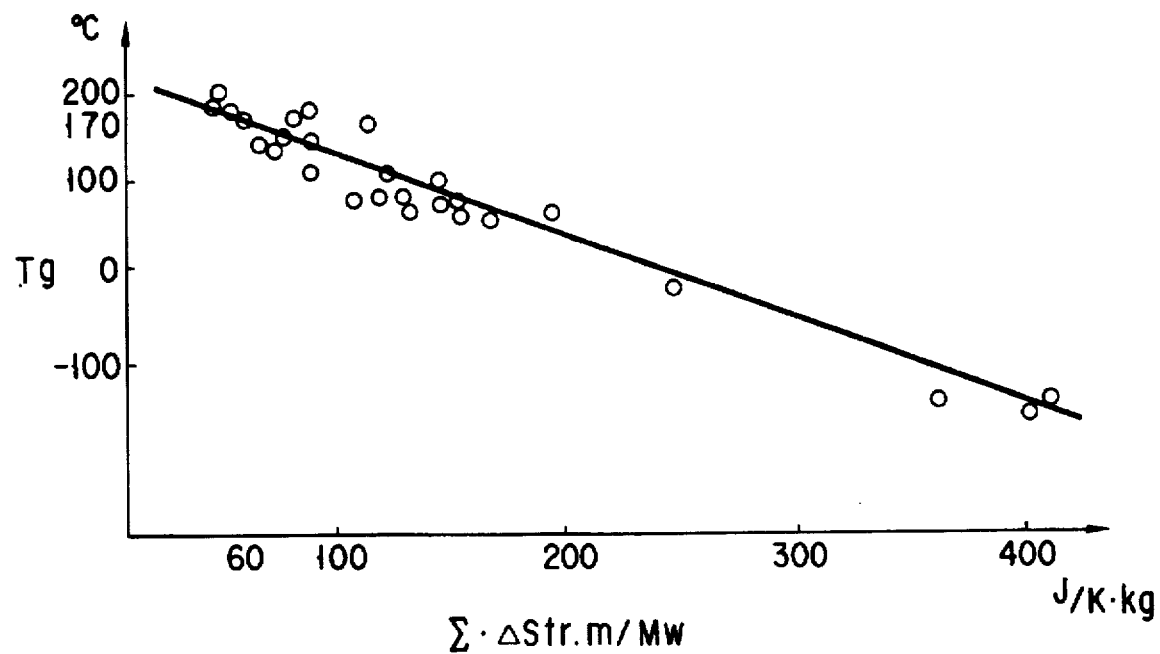
F I G. 1
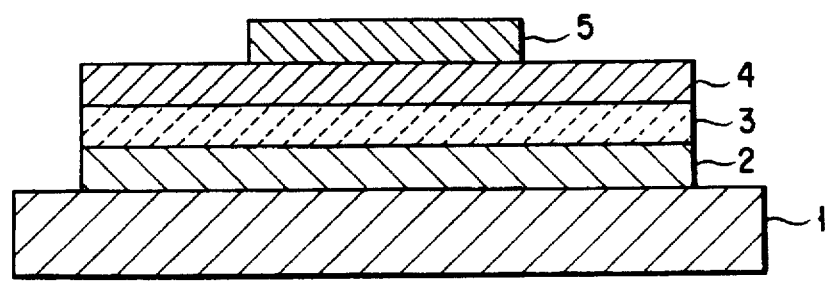
F I G. 2

AMORPHOUS ORGANIC THIN-FILM DEVICE, AMORPHOUS ORGANIC POLYMER COMPOSITION, AND AMORPHOUS INORGANIC COMPOSITION

This application is a continuation of application Ser. No. 08/281,034, filed on Jul. 27, 1994, now abandoned.

BACKGROUND OF THE INVENTION

1. Field of the Invention

The present invention relates to an amorphous organic thin-film device, an amorphous organic polymer composition, and an amorphous inorganic composition for use in various applications.

2. Description of the Related Art

Recently, various types of electronic devices using thin films of organic materials have been extensively researched. Among the films of organic materials, an amorphous thin film is particularly important in view of transparency, homogeneity, and stability since the amorphous thin film has no grain boundary. For example, as an organic photosensitive thin film used in electrophotography according to the Carlson process, an amorphous thin film consisting of an amorphous polymer in which a charge-generation agent or a charge-transport agent is dispersed or dissolved homogeneously. As for an ultra thin film of organic materials, typically such as Langmuir-Blodgett film (LB film), an amorphous LB film consisting of a polymer or a dye is more homogeneous than the crystalline LB film formed of an aliphatic acid. The amorphous LB film has excellent properties as an ultra thin insulating film (e.g., Jpn. Pat. Appln. KOKAI Publication No. 63-166261). In recent years, electroluminescence (EL) devices using vapor-deposited films of organic materials have been developed (e.g., Jpn. Pat. Appln. KOKAI Publication Nos. 57-51781, 59-194393, and 63-295695). In the EL devices, to decrease an applied voltage, a thin film of several tens of nanometers in thickness is required. In order to obtain a device which is durable against the vapor deposition process for an upper electrode and which has no electrical short circuit and high operational stability, amorphous thin films are used. Further, an organic thin film which efficiently transports electrons or holes is required not only for the aforementioned organic photosensitive bodies and the organic El devices, but also for organic photovoltaic cells, organic rectifying devices, and the like. Hence, a stable amorphous thin film is strongly desired in these electronic devices.

Further, an amorphous organic polymer composition consisting of an amorphous polymer containing a dye molecule, is employed not only as a thin film in the aforementioned organic photosensitive bodies, but also as a bulk material used in photoresist thin films, optical switching devices using optical waveguides, optical disks, and the like. In addition, the amorphous organic polymer composition is widely used as various coating thin films. Furthermore, an amorphous inorganic composition consisting of an inorganic glass containing a functional dye molecule, is used as various optical functional materials (e.g., Jpn. Pat. Appln. KOKAI Publication Nos. 2-302329 and 61-74638).

Hitherto, however, with the exception of thin films comprising a polymer, amorphous thin films consisting of a low molecular-weight dye molecule have rarely been realized in electronic devices. The major reason for this is that due to low glass transition temperatures (Tg) of most amorphous thin films consisting of low molecular-weight materials, the crystallization is facilitated by heat generated when devices are driven, and degradation of amorphous thin films easily develops. In addition, a composition consisting of a polymer containing a low molecular-weight dye molecule carries a drawback in that when a dye having low Tg in a bulk state is used in such a composition, the Tg of the entire composition decreases, leading to a decrease in heat resistance. Note that in such a composition, if a crystalline dye is added to the polymer, the decrease in Tg can be prevented. However, in such a composition, it is impossible to raise the concentration of the dye since it is difficult to attain a homogeneous dispersion. Although the heat resistance can be improved if the dye molecules are chemically bound to the polymer, a difficulty in synthesis accompanies that. The same problems as those of the above-mentioned polymer composition arise in the case where the dye is contained in an inorganic glass by means of e.g., a sol-gel method. Particularly, since the highly ionic inorganic glass is generally poor in compatibility with various hydrophobic dyes, it is difficult to raise the concentration of the dye.

From the foregoing, the demand has been increased to develop a low molecular-weight dye available for amorphous thin films which can be used in various types of electronic devices. However, amorphous thin films obtained from conventional low molecular-weight dyes have problems in that the films fail to have sufficient heat resistance due to low Tg and also it is difficult to raise the concentration of the dye.

SUMMARY OF THE INVENTION

It is an object of the present invention to develop a dye molecule from which a thin film or a bulk having high Tg can be obtained, thereby providing an amorphous organic thin-film device, an amorphous organic polymer composition, and an amorphous inorganic composition which have excellent heat resistance, a long life time, and satisfactory optical or electronic characteristics.

The amorphous organic thin-film device of the present invention comprises an organic thin film containing a dye molecule, wherein the dye molecule has a molecular structure containing an aromatic skeleton and three or more dye skeletons which respectively bond to the aromatic skeleton via a chemical bond formed by a condensation reaction.

Examples of the chemical bonds formed by a condensation reaction include an ester linkage, an amide linkage, a urethane linkage, a carbonate linkage, a thioester linkage, a urea linkage, a thiourea linkage, an ether linkage, a hydrazone linkage, a carbamate linkage and thioether linkage. It is preferable that at least one of three or more dye skeletons possess a substituent which can generate a hydrogen bond.

The other amorphous organic thin-film device of the present invention comprises an organic thin film containing a dye molecule, wherein the dye molecule has a molecular structure containing a heterocyclic aromatic skeleton and three or more dye skeletons which bind to the heterocyclic aromatic skeleton so as to form a $\pi$ electron conjugated system.

It is preferable that at least one of three or more dye skeletons possess a substituent which can generate a hydrogen bond, and that the heterocyclic aromatic skeleton contains an $sp^2$ nitrogen atom.

In the present invention, a composition can be prepared from an amorphous organic polymer in which one of the aforementioned two types of dye molecules is contained, and a composition prepared from an inorganic material in which one of the aforementioned two types of dye molecules is contained.

BRIEF DESCRIPTION OF THE DRAWINGS

FIG. 1 is a characteristic diagram showing the relationship between ΣΔStr,m/Mw and Tg regarding various types of dye molecules;

FIG. 2 is a elevational sectional view of an example of organic electroluminescence device;

DETAILED DESCRIPTION OF THE PREFERRED EMBODIMENTS

Figure 3:
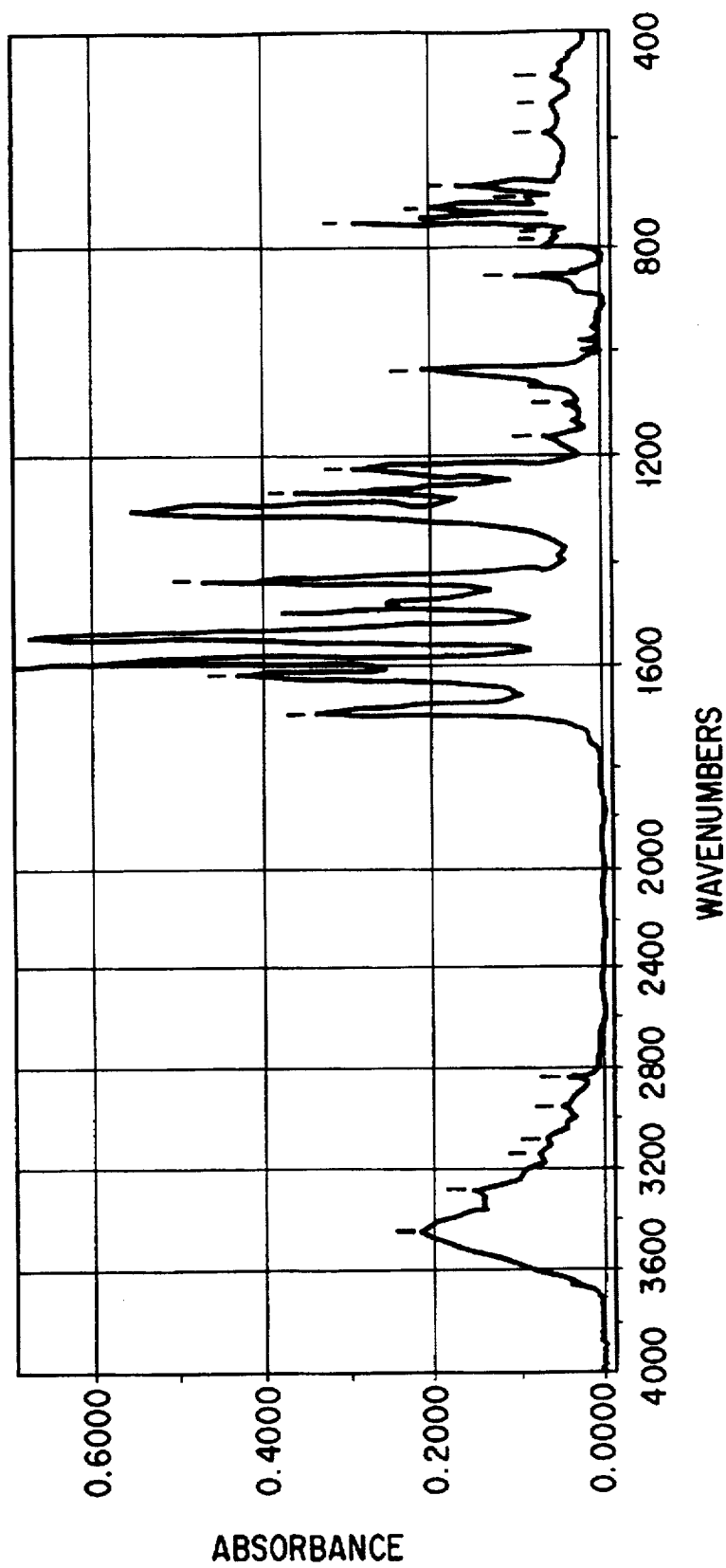
FIG. 3 is an infrared spectrum of an oxadiazole derivative represented by the formula (3), according to the KBr disk method.

Hereinbelow, the present invention will be described in detail.

Generally, in an organic thin film, the heat resistance thereof can be increased by raising a glass transition temperature (Tg) of an organic material to be used. The present inventor has investigated various dye molecules with respect to the relationship between a thermodynamic parameter (ΣΔaStr,m/Mw) and Tg. Where, Mw is a dye molecular weight, ΣΔStr,m is the sum total of an entropy change of melting and entropy changes of transition from a glass transition point to a melting point in a dye crystal. In this study, the glass transition temperatures (Tg) of individual dyes were measured by means of a commercially available differential scanning calorimeter (DSC) under the same conditions: a sample weight of 10 to 20 mg, a heating rate of 0.08° C./s. Note that the sum total of an entropy change of melting and entropy changes of transition from a glass transition point to a melting point, is a physical value inherent in a substance. The results are shown in FIG. 1.

Judging from FIG. 1, it is necessary to decrease ΣΔStr, m/Mw to raise a value of Tg. It is expected that Tg of a dye can be increased if a value of ΣΔStr,m/Mw is reduced by synthesizing a dye molecule having a large Mw. However, in general, with Mw is raised, ΣΔStr,m also increases. Hence, to increase Tg, it is necessary to increase Mw without increasing ΣΔStr,m. The present inventor carried investigation farther with respect to the relationship between ΣΔStr,m and Mw pertaining to individual dyes. As a result, he found that Mw can be increased without providing a significant increase in ΣΔStr,m if a dye molecule has a good symmetrical molecular structure of a spherical form with high density.

Important properties of the amorphous thin film other than Tg include a maximum crystal growth velocity, MCV (mm/min) and Tc,max which is a temperature at which a maximum crystal growth is attained. With MCV decreases, crystallization becomes difficult to be induced. This property facilitates the formation of an amorphous thin film and the resultant amorphous thin film acquires stability. The higher Tc,max becomes, the harder the crystallization of the amorphous thin film is induced by heat generated when a device is driven.

The present inventor found that the smaller ΣΔStr,m/Mw, the larger Tc,max, and that MCV has a correlation with an enthalpy change of melting ΔHm(kJ/mol) and the melting point Tm(K), and further found that the larger Mw/(Tm/ΔHm) becomes, the smaller MCV becomes. Note that ΔHm corresponds to the intensity of cohesive force between molecules. Hence, to decrease MCV, it is necessary to weaken the cohesive force and is effective to make the molecule nearly spherical with good symmetriy.

In view of the findings, the present inventor paid attention to a dye molecule having a molecular structure which has three or more dye skeletons bound around an aromatic skeleton thereof. Up until now, a device comprising an amorphous thin film with high Tg containing a dye molecule having aforementioned molecular structure, for example, represented by the following formula (23) has been proposed in Pat. Appln. KOKAI Publication No.5-152072. However, in the dye molecule, since dye skeletons bind directly to the aromatic skeleton located at the center, π electrons conjugate each other, with the result that an absorption wavelength and a fluorescence wavelength shift to the longer wavelength side, compared to the inherent wavelength of the dye. Therefore, in this device, even if a dye molecule is designed in accordance with requisitive characteristics of the device, a shift of the absorption wavelength and fluorescence wavelength inevitably occurs, causing a problem in that the optical and electronic characteristics of the device changes due to the shift of wavelength. Besides this, the aforementioned dye molecule is difficult to synthesize since the synthesis requires many steps.

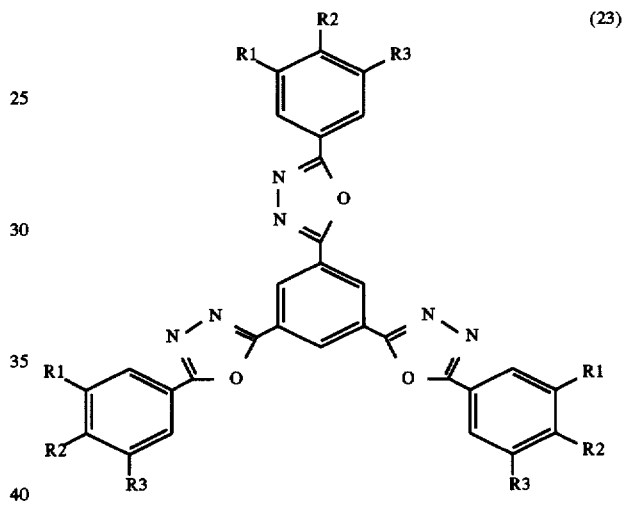

(23)

wherein R1, R2, and R3 are selected from the group consisting of —NH₂, —N(CH3)₂ and —N(C₂H₅)₂.

In the present invention, use is made of a dye molecule consisting of an aromatic skeleton and three or more dye skeletons which are introduced into the aromatic skeleton via chemical bonds formed by a condensation reaction so as to exhibit high heat resistance, satisfactory optical and electronic characteristics. The dye molecule to be used in the present invention has chemical bonds formed by a condensation reaction between the aromatic skeleton and dye skeletons. For this reason, the dye molecule of the present invention differs from the dye molecule represented by the formula (23). To be more specific, the dye molecule used in the present invention can be represented by the following formula (1):

R-[X-Y]$_n$ (1)

wherein R represents an aromatic skeleton; X represents a linkage group containing a chemical bond formed by a condensation reaction such as-an ester linkage, an amide linkage, a urethane linkage, a carbonate linkage, a thioester linkage, a urea linkage, a thiourea linkage, an ether linkage, a hydrazone linkage, a carbamate linkage or a thioether linkage; Y represents a dye skeleton with or without a substituent; and n is an integer of 3 or more, in which n members of X and Y may be the same or different.

In the present invention, a dye molecule is used, which has a nearly spherical form consisting of an aromatic skeleton typically such as a benzene ring, a biphenyl ring, and a condensed ring, around of which three or more dye skeletons are introduced via chemical bonds formed by a condensation reaction. It is preferable that the dye skeletons be introduced into an aromatic skeleton in such a way that the resultant dye molecule is not a linear nor an asymmetrical structure but a structure as symmetrical spherical as possible. An example of such a dye molecule is a dye molecule having a molecular structure containing the dye skeletons which are symmetrically introduced into 1-,3-, and 5-positions of a benzene ring, or 3-, 3'-, 5-, and 5'-positions of a biphenyl ring.

The aromatic skeleton is not particularly restricted as long as it is trivalent or more. For example, the following skeletons (A-1) to (A-41) may be used.

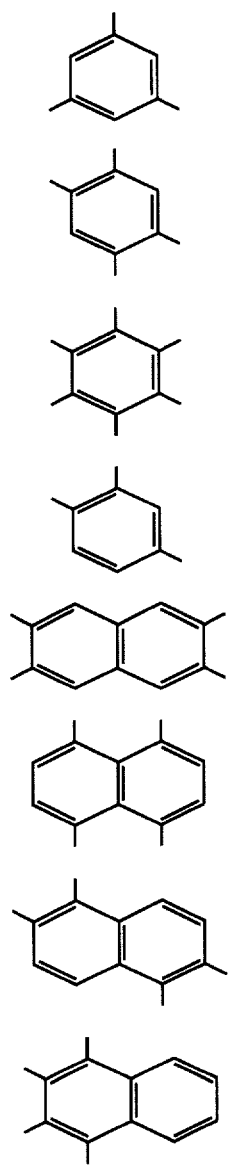

(A-1)
(A-2)
(A-3)
(A-4)
(A-5)
(A-6)
(A-7)
(A-8)

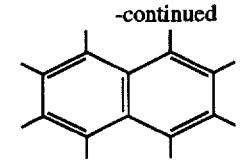
(A-9)

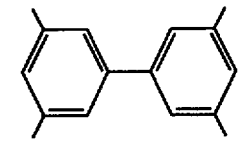
(A-10)

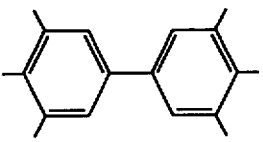
(A-11)

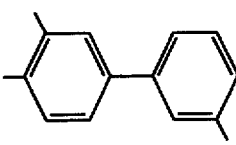
(A-12)

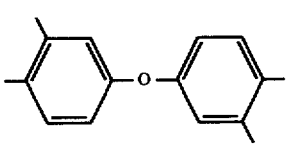
(A-13)

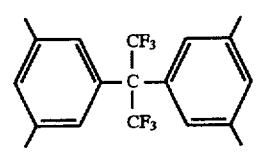
(A-14)

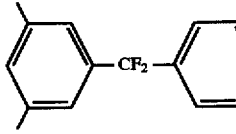
(A-15)

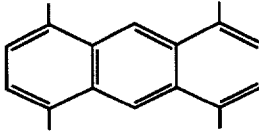
(A-16)

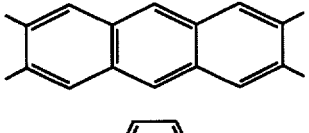
(A-17)

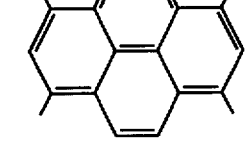
(A-18)

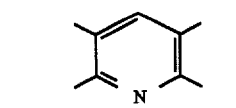
(A-19)

-continued
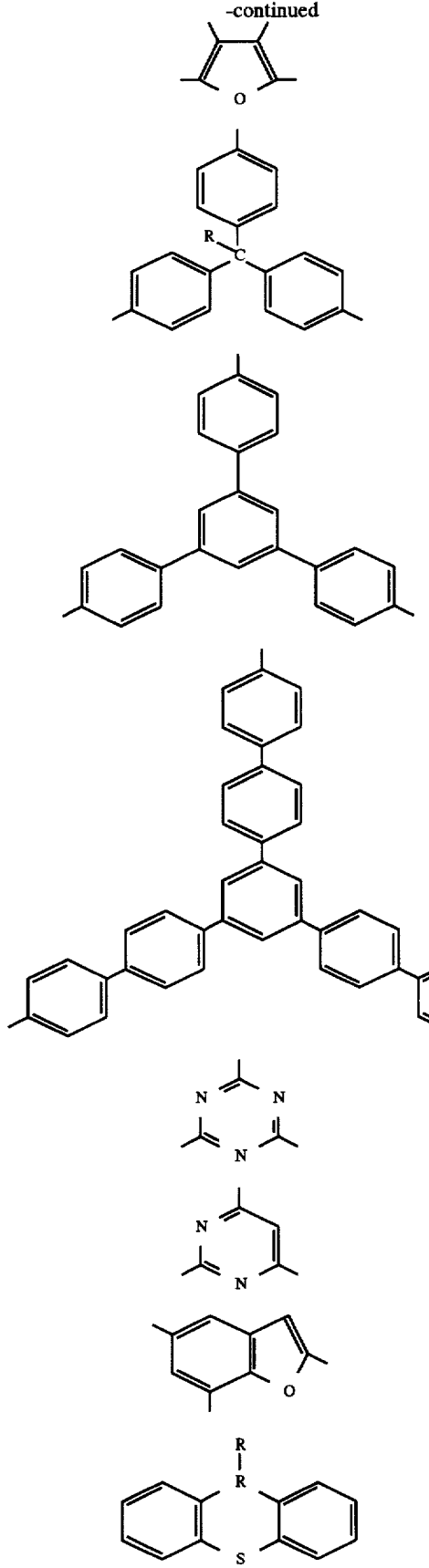
(A-20)
(A-21)
(A-22)
(A-23)
(A-24)
(A-25)
(A-26)
(A-27)
-continued
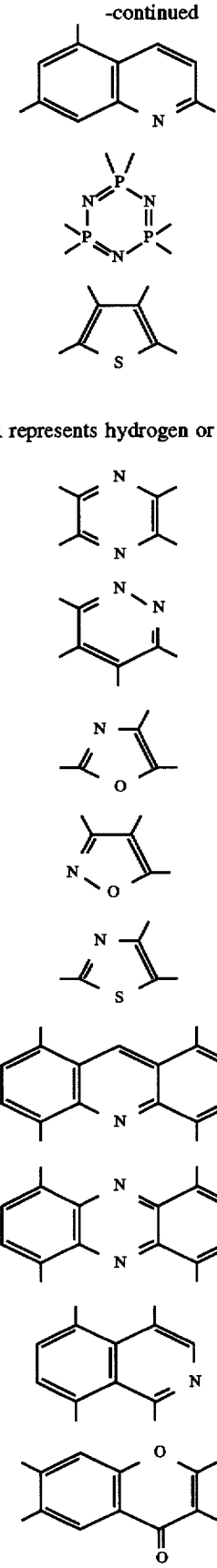
(A-28)
(A-29)
(A-30)
wherein R represents hydrogen or an alkyl group.
(A-31)
(A-32)
(A-33)
(A-34)
(A-35)
(A-36)
(A-37)
(A-38)
(A-39)

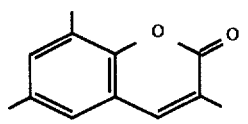
(A-40)
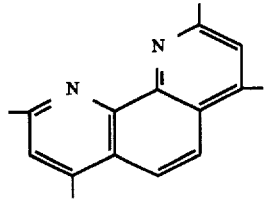
(A-41)
Three or more dye skeletons may be the same or different and can be selected in accordance with its usage. For example, the following skeletons (B-1) to (B-79) may be used. However, the skeleton is not restricted to them.
Fulvalenes
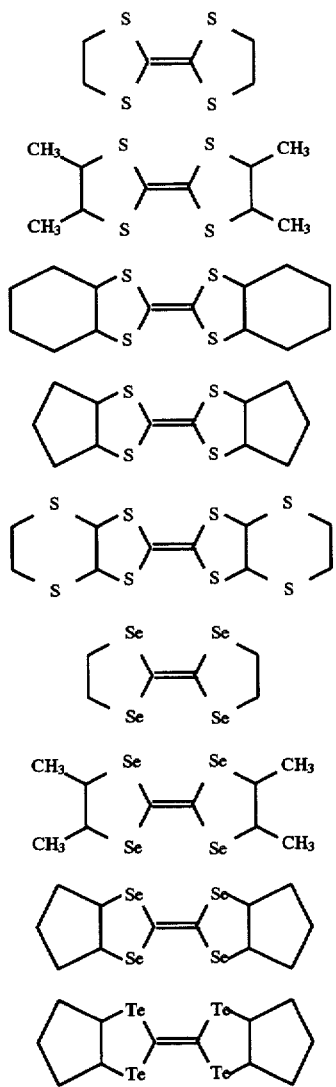
Heterocyclic compounds containing an ion
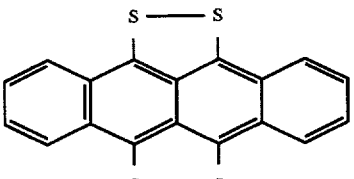
(B-10)
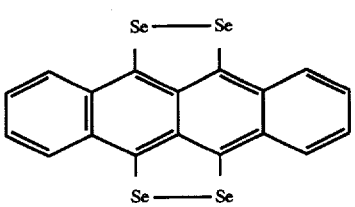
(B-11)
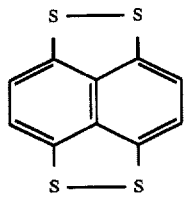
(B-12)
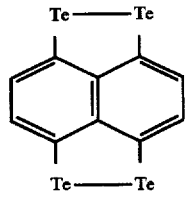
(B-13)
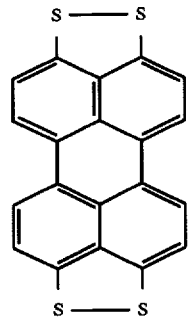
(B-14)
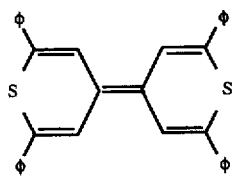
(B-15)
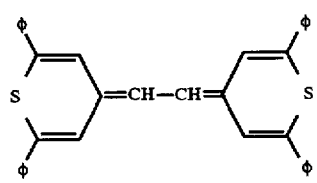
(B-16)

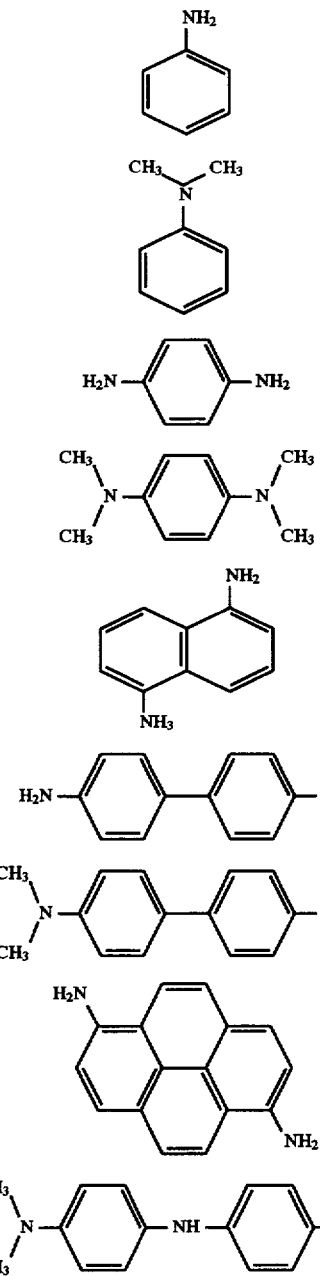
wherein φ represents an aryl group.
wherein R represents hydrogen or an alkyl group.

-continued
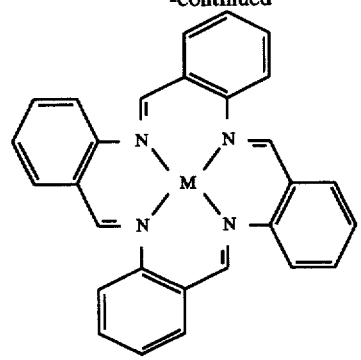
(B-35)
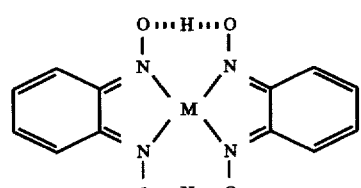
(B-36)
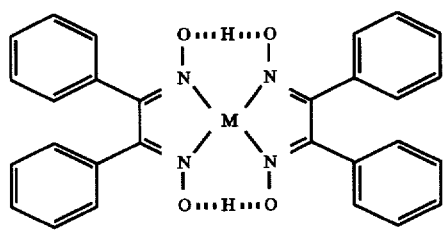
(B-37)
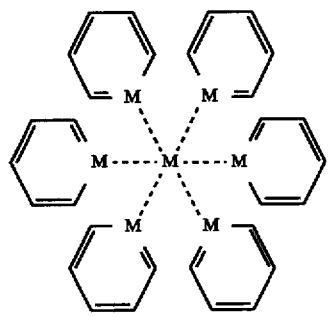
(B-38)
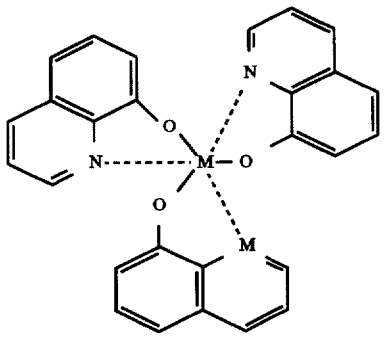
(B-39)
wherein M represents a metal ion capable of forming a complex compound
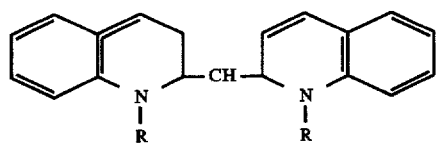
(B-40)
-continued
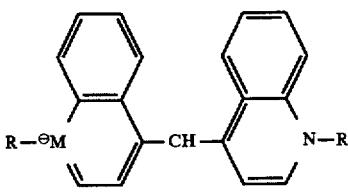
(B-41)
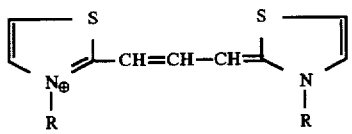
(B-42)
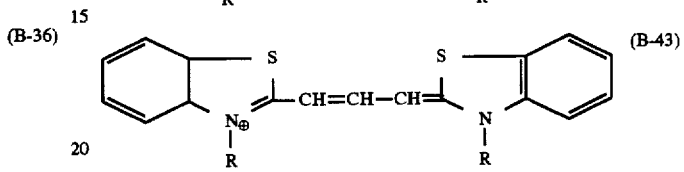
(B-43)
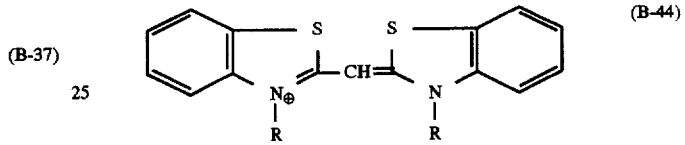
(B-44)
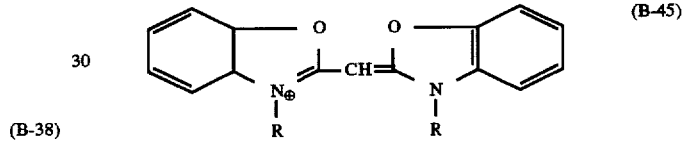
(B-45)
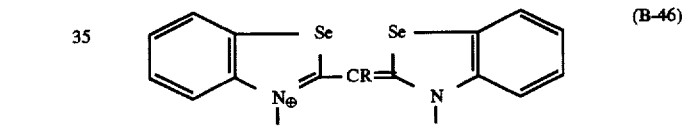
(B-46)
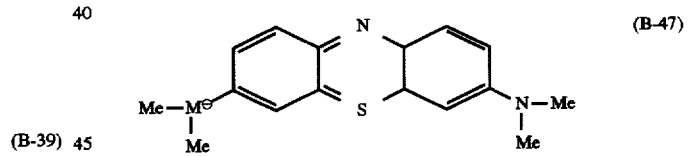
(B-47)
wherein Me represents a methyl group and R represents an alkyl group.
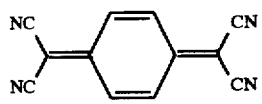
(B-43)
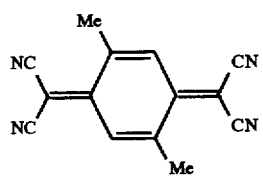
(B-49)
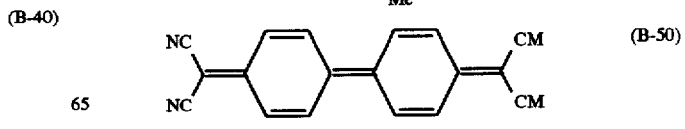
(B-50)

-continued
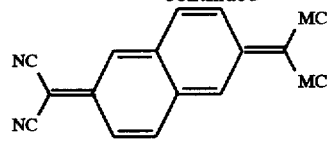 (B-51)
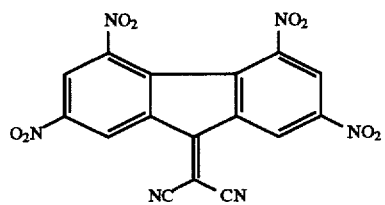 (B-52)
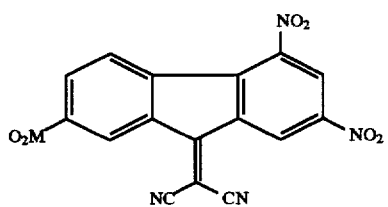 (B-53)
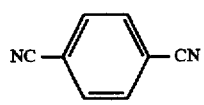 (B-54)
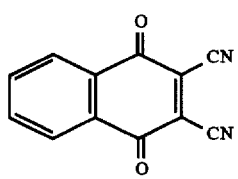 (B-55)
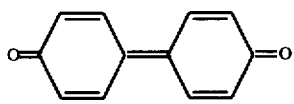 (B-56)
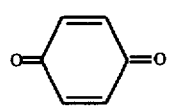 (B-57)
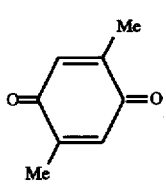 (B-58)
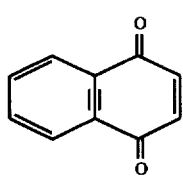 (B-59)
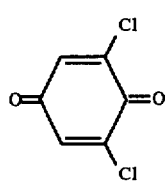 (B-60)
-continued
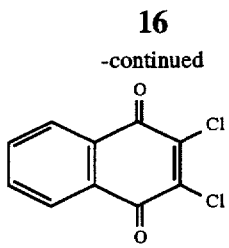 (B-61)
wherein Me represents a methyl group.
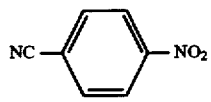 (B-62)
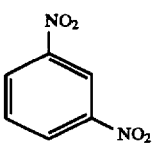 (B-63)
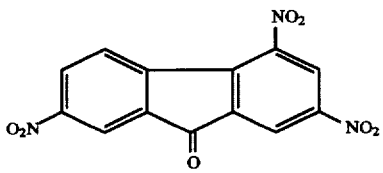 (B-64)
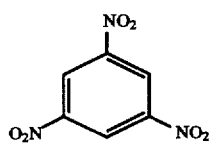 (B-65)
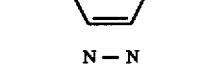 (B-66)
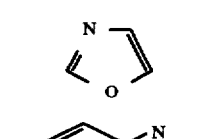 (B-67)
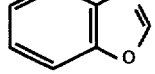 (B-68)
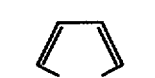 (B-69)
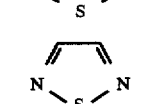 (B-70)
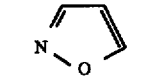 (B-71)
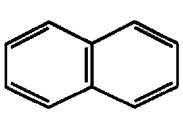 (B-72)
 (B-73)

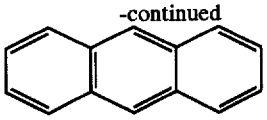 (B-74)

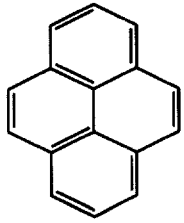 (B-75)

Others

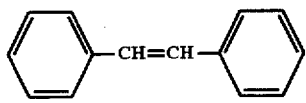 (B-76)

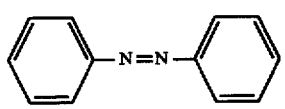 (B-77)

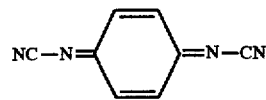 (B-78)

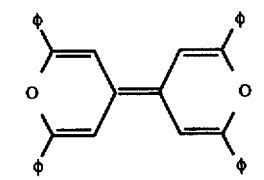 (B-79)

wherein φ represents an aryl group.

Such a dye skeleton may have an appropriate substitutent. Particularly, when the dye molecule has a substituent which can generate a hydrogen bond such as a hydroxyl group, a carboxyl group, an amido group, an amino group, a urethane group, or urea group is used, Tg of the resultant film can be improved by virtue of a hydrogen bond generated between molecules. On the other hand, when an alkyl group is used as a substituent, Tg and film-forming properties can be further adjusted by varying the type of alkyl group to be used.

Linkage groups containing a chemical bond formed by a condensation reaction may contain other linkage as long as it contains a chemical linkage such as an ester linkage, an amido linkage, a urethane linkage, a carbonate linkage, a thioester linkage, a urea linkage, a thiourea linkage, an ether linkage, a hydrazone linkage, a carbamate linkage or thio-ether linkage represented by the formula below. Since Tg of the resultant film increases when the hydrogen bond generates between dye molecules, it is preferred to use a chemical linkage which can generate the hydrogen bond between molecules, such as an amido linkage, a urethane linkage, a urea linkage, or a thiourea linkage.

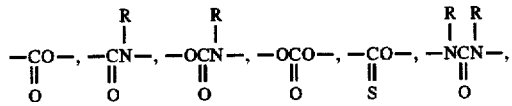

wherein R is hydrogen atom, an alkyl group or an aryl group.

In the dye molecule represented by the formula (1), since a central aromatic skeleton thereof binds to an outer dye skeletons via chemical bonds formed by a condensation reaction, a π electron conjugated system of the dye skeletons hardly expands over the chemical bond. Hence, compared to the wavelength inherent in the dye skeleton, the absorption wavelength and fluorescence wavelength of the dye molecule represented by the formula (1) do not shift to the long wavelength side, thereby successfully suppressing the change in the optical and electronic characteristics. The dye molecule represented by the formula (1) can be synthesized by a condensation reaction between a polyfunctional aromatic skeleton and monofunctional dye skeletons. Since such a condensation reaction is generally performed under mild conditions and provides a high yield, a desired dye molecule can be readily obtained. Further, when a thin film or a bulk is formed using a dye molecule consisting of an aromatic skeleton in which three or more dye skeletons are introduced as shown in the formula (1), it generally has a higher Tg value by 10° to 200° C. than that formed of a dye molecule consisting of an aromatic skeleton to which only two similar dye skeletons are introduced.

As a method of forming the amorphous organic thin film according to the present invention, common methods can be used, which include a cast method, a vapor-deposition method, an LB method, a water-surface development method, an electrodeposition method, and the like. Among them, the vapor-deposition method is simple and advantageous particularly in forming a multi-layered film.

In the present invention, a film having further higher heat resistance can be obtained by generating a chemical bonding between dye molecules, on or after the film forming process. For the purpose of generation of the chemical bond, there is a method of polymerizing unsaturated bonds by ultraviolet rays or x-rays radiation, on or after the film forming process, using a dye molecule containing a group having a polymerizable unsaturated bond, such as a vinyl group, a diacethylene group, or an allyl group. Alternatively, in order to obtain such a chemical bond, an organic thin film is formed of a cross-linking agent and a dye molecule having a condensable substituent such as a hydroxyl group, an amino group, a carboxyl group, a thiol group, or an aldehyde group, and the cross linking agent and the dye molecule may be allowed to react each other, on and after the film forming process. As an cross-linking agent to be used with a dye molecule containing a hydroxyl group and an amino group, for example, a diisocyanate compound can be used.

In the present invention, an amorphous organic polymer composition can be provided by adding a dye molecule represented by the formula (1) to an amorphous organic polymer. In this case, the content of the dye molecule in the amorphous organic polymer composition is, desirably, 5 wt % or more, and 80 wt % or less. If the content is less than 5 wt %, the properties of the dye molecule may not be sufficiently available. On the contrary, if the content exceeds 80 wt%, the polymer properties may not sufficiently appear.

The polymer constituting the amorphous organic polymer composition is not particularly restricted as long as it is an amorphous polymer. However, it is preferable that the molecular weight of the polymer be 3000 or more. More preferably, the molecular weight is 50,000 or more and 500,000 or less, taking properties as a polymer and formability thereof into consideration.

Further, in the present invention, an amorphous inorganic composition can be provided by adding a dye molecule represented by the formula (1) to an amorphous inorganic material. In this case, the content of the dye molecule in the amorphous inorganic composition is desirably 5 wt % or more, and 80 wt % or less. If the content is less than 5 wt %, the properties of the dye molecule may not be sufficiently available. On the contrary, if the content exceeds 80 wt %, the properties as the inorganic material may not sufficiently appear.

The inorganic material constituting the amorphous inorganic composition is not particularly restricted as long as it is an amorphous inorganic material. For example, an inorganic glass such as a silica glass, or a borate glass can be used. Particularly, in order to mix the dye molecule in a simple manner, an inorganic glass is preferable which is prepared by a sol-gel method using an organic solvent. In the sol-gel method, it is necessary that a temperature of heat treatment for obtaining a glass be less than the decomposing or denaturing temperature of the dye molecule. A practical heat treatment temperature varies depending on the dye molecule to be used; however, a temperature of 200° C. or less is preferable.

Since an inorganic glass, particularly, an oxide glass has a strong polarity of metal—oxygen bond, the inorganic glass and a non-polarized dye molecule are poor in compatibility each other. Particularly, when the concentration of the dye molecule is high, it is very difficult to homogeneously disperse the dye molecule in the inorganic glass by a conventional method. However, since the dye molecule according to the present invention contains three or more chemical bonds having a polarity, it can be homogeneously dispersed in the inorganic glass by virtue of interaction with the inorganic glass, even if the dye molecule present in a high concentration. In addition, by virtue of the interaction, even in higher temperatures, diffusion of the dye molecule rarely occurs, resulting in an increase in heat resistance. In particular, the dye molecule having chemical bonds which can generate a hydrogen bond can bind to a constitutional atom (mostly an oxygen atom) of the inorganic glass with a hydrogen bond, thereby improving compatibility and heat resistance.

To return to the conventional dye molecules, their properties are not of a satisfactory level since they generally have poor heat resistance as described above and their charge transporting ability, in particular, electron-transport ability is not sufficient for use as a functional dye molecule. Taking the aforementioned dye molecule represented by the structure (23) as an example, its electron-transport ability has been improved but its function is still insufficient.

In the present invention, to improve the charge-transport ability, the dye molecule is used having a heterocyclic aromatic skeleton and three or more dye skeletons bound to the heterocyclic aromatic skeleton in such a way that π electrons conjugate. To be more specific, such a dye molecule can be represented by the following formula (2):

$$R'\text{-}[X'\text{-}Y]_n \qquad (2)$$

wherein R' represents a heterocyclic aromatic skeleton, X' represents a member selected from the group consisting of a single linkage —O—, —NH—, —NR"CO—, where R" represents a hydrogen atom, an alkyl group or an aryl group, and Y and n are the same as those in the formula (1).

In the dye molecule represented by the formula (2), by appropriately choosing a heterocyclic aromatic skeleton having the highest occupied molecular orbital level or the lowest unoccupied molecular orbital level (referred to as "HOMO level", "LUMO level", respectively), and then, by binding three or more dye skeletons to the heterocyclic aromatic skeleton so as to generate π electron conjugated system, the HOMO level or the LUMO level of the entire dye molecule can be controlled, improving of the charge-transport ability.

The heterocyclic aromatic skeleton of the dye molecule represented by the formula (2) is not particularly restricted. Examples of the heterocyclic aromatic skeletons include the aforementioned (A-19), (A-20), (A-24) to (A-41), and the like. Three or more dye skeletons may be the same or different, and may be chosen in accordance with their respective usages. Examples of the dye skeletons include the aforementioned (B-1) to (B-79), and the like. The dye skeleton may have a substituent. When the dye skeleton has a substituent such as a hydroxyl group, an amido group, an amino group, a urethane group, or a urea group, Tg of the resultant film can be improved more by virtue of a hydrogen bond generated between molecules. On the other hand, in the case where an alkyl group can be used as a substituent, Tg and film forming property can be adjusted by varying the type of alkyl group to be employed. For the aforementioned reasons, it is preferable that the dye molecule has the dye skeletons introduced so as to be made in a nearly spherical form.

In the dye molecule represented by the formula (2), the HOMO level and the LUMO level can be controlled by choosing the type and the number of hetero atoms present in the heterocyclic aromatic skeleton. To be more specific, the heterocyclic aromatic skeleton having an $sp^2$ nitrogen atom or phosphorus atom is superior in the acceptor property and lower in the LUMO level, to the corresponding carbocyclic aromatic skeleton. In particular, the dye molecule having an $sp^2$ nitrogen atom in the heterocyclic aromatic skeleton increases in the acceptor property. This is considered effective in view of the present circumstance in which the dye molecule having a strong acceptor property is desired. On the other hand, the heterocyclic aromatic skeleton having oxygen, sulfur, selenium, $sp^3$ nitrogen, and the like, increases in donor property and the HOMO level. Therefore, as described above, the HOMO level and the LUMO level of an entire dye molecule can be controlled by the conjugation between the heterocyclic aromatic skeleton and the dye skeletons. The HOMO level and the LUMO level of the dye molecule can be controlled in a broader range if the most suitable heterocyclic aromatic skeleton is chosen, compared to the case in which the control is performed depending on only a molecular design of the dye skeleton.

In the dye molecule represented by the formula (2), in the case where the dye skeletons and the heterocyclic aromatic skeleton are directly bound to each other on their $sp^2$ or sp carbons, the degree of conjugation is the highest. However, in the case where the dye skeletons are indirectly bound to the heterocyclic aromatic skeleton via an appropriate linkage group, π conjugation occurs to some extent. To be more specific, when they bind to each other via an oxygen atom or an nitrogen atom having a lone pair of electrons, π electron conjugation occurs although the degree of the conjugation is smaller, compared to the case in which the binding is effected between $sp^2$ or sp carbons. When they bind each other via an amido bond or an $sp^3$ carbon, the π conjugation occurs although the degree of the conjugation is significantly small. When the π conjugation occurs between the heterocyclic aromatic skeleton and the dye skeletons, even if its degree is small, the HOMO level and the LUMO level can be effectively controlled.

In the case where an amorphous organic thin film is formed using a dye molecule represented by the formula (2), the aforementioned common method can be applied. Among them, the vapor-deposition method is simple and advantageous particularly in forming a multi-layered film. In an attempt to attaining higher heat resistance, it is an effective method to generate a chemical bond between dye molecules, on or after the film forming process.

In the present invention, an amorphous organic polymer composition can be provided by adding a dye molecule represented by the formula (2) to an amorphous organic polymer. In this case, the content of the dye molecule in the composition and the molecular weight of the polymer are the same as those described above. Alternatively, an amorphous inorganic composition can be provided by adding a dye molecule represented by the formula (2) to an amorphous inorganic material. In this case, the content of the dye molecule and the inorganic compound to be used are the same as above.

Hereinbelow, application examples can be briefly explained.

(Organic electroluminescence device)

FIG. 2 is a elevational sectional view of an example of an organic electroluminescence device (EL device). As shown in FIG. 2, the EL device has a structure in which an organic thin film is sandwiched between two electrodes 1 and 5. The organic thin film sandwiched has a three-layered structure in which luminescent layer 3 containing fluorescent dye molecules is placed between a hole-transport layer 2 and an electron-transport layer 4. At least one of the two electrodes 1 and 5 (e.g., electrode 1) is a transparent electrode. The organic thin film layer may be a multi-layered structure of four layers or more, or a two-layered structure consisting of a luminescent layer and the hole-transport layer or the electron-transport layer. In the organic EL device of either structure, electrons and holes are injected into the luminescent layer and recombined each other, thereby emitting light. The electron-transport layer and the hole-transport layer have a function to increase an injection probability of carriers.

(Organic solar cell)

An organic solar cell has a structure in which an organic thin film is sandwiched between two electrodes. The organic thin film may have a two-layered structure consisting of a charge-generation layer containing dye molecules which absorb visible light and generate electrons and holes, or multi-layered structure constituted by three or more layers having a charge-generation layer placed between a hole-transport layer and an electron-transport layer. At least one of the two electrode is a transparent electrode. In the cell of either structure, charges can be efficiently separated so that generated electrons and holes are prevented from recombining with each other, increasing the photoelectric conversion efficiency.

(Organic photosensitive body for electrophotography)

A photosensitive body has a structure on metal formed by stacking a charge-generation layer and either a hole transport agent or an electron transport agent in sequential order. The charge generation layer contains dye molecules which adsorb visible light and generate electrons and holes.

In the case where the hole-transport layer is employed in the photosensitive body, the surface of the photosensitive body is negatively charged with corona discharge or the like. In the case of electron-transport layer, the surface of the photosensitive body is positively charged. Thereafter, when recording light is irradiated on the photosensitive body, electrons and holes are generated only in the irradiated portion. In the hole transport layer, the holes can be efficiently transported to the surface of the film of the photosensitive body and cancels the negative charges. When the film is developed using toner which has been positively charged, toner adheres onto the non-irradiated portion, thereby printing the obtained toner image on paper. On the other hand, in the electron-transport layer, electrons are efficiently transported to the surface of the film of the photosensitive body and cancels the positive charges. When the film is developed using toner which has been negatively charged, toner adheres onto the non-irradiated portion. As a result, the obtained toner image can be printed on paper.

(Organic rectifying device)

An rectifying device has a structure in which an organic thin film is sandwiched between two electrodes. The organic thin film sandwiched contains a hole-transport layer (P-type semiconductor) and an electron-transport layer (N-type semiconductor). In this device, rectification occurs in the same manner as in a P-N junction of an inorganic semiconductor. Further, as is the same manner as in the case of the inorganic semiconductor, when a small amount of acceptors and donors are doped into the hole-transport layer and the electron-transport layer, respectively, the current density can be increased.

(Optical switching device)

A switching device has a structure constituted of an organic thin film in which an optical path (waveguide) having a different refractive index from the surrounding region, is formed so as to be branched. In this device, when electric voltage is applied to one of branches of the waveguide, the refractive index thereof changes, causing a shift of the phases of the light components with different optical path lengths by exactly half a wavelength. This shift induces interference of light at the confluent point of the branched waveguide. An output light is therefore switched on and off in accordance with the presence and absence of the voltage application.

(Optical disk)

As an optical disk, use is made of a thin film consisting of dye molecules which absorb semiconductor laser beams, or the thin film consisting of an amorphous polymer in which dye molecules are homogeneously mixed/ Writing is performed by radiating a laser light to the film. The temperature of the irradiated spots increases and the crystallization of the dye molecule occurs. In this way, the writing is completed. Since the crystallized spots scatter the light, reading of the data is carried out. To erase the data, the disk film is melted by further raising temperature and returned to a homogeneous amorphous state.

(Photochemical hole burning (PHB) optical memory)

An amorphous organic polymer composition or an amorphous inorganic composition in which dye molecules are dispersed, are cooled with liquid nitrogen. To this composition, laser beams are irradiated having very narrow wavelength width which falls in the range of the absorption band of the dye molecules having a wide wavelength width. The dye molecules absorbing the laser beams are then subjected to a photochemical reaction, thereby recording sharp holes having a reduced absorption strength, on the original wide absorption band corresponding to the wavelength of the laser beams. When the wavelength of the laser is varied, a plurality of holes can be generated in a spot, thereby achieving multiple recording.

(Color filter)

A resist consisting of an amorphous organic polymer composition in which dye molecules are dispersed, is coated on a glass substrate, followed by patterning by light to cure a light-exposed portion. The unexposed portion is removed with a solvent, and then another resist consisting of an amorphous organic polymer composition in which another dye molecules are dispersed, is coated on the glass, and exposed to light to form a pattern. By repeating this procedure using the three primary colors, red, green, and blue, a color filter to be used in a liquid crystal display can be manufactured.

It is a matter of course that the present invention is not restricted to the aforementioned thin film devices or bulk materials and can be applied to a wide range of usages requiring heat resistance, such as a surface coating material.

EXAMPLES

Synthesis example 1

Synthesis of oxadiazole derivative 1

1.5 g of 1,3,5-benzenetricarboxylic trichloride and 5.5 g of 5-(2-aminophenyl)-2-(3-methoxyphenyl)-1,3,4-oxadiazole were reacted in dry pyridine for 5 hours at 80° C. The reaction mixture was added to 1000 ml of water. Then the generated precipitate was filtrated, and further washed well with acetone and warmed ethanol, thereby obtaining 4.5 g of the oxadiazole derivative represented by the following formula (3) in a white powder form.

| Elemental analysis: $C_xH_yN_zO_a$ | | | |
|---|---|---|---|
| | Carbon | Hydrogen | Nitrogen |
| (Theoretical value) | 67.7% | 4.1% | 13.2% |
| (Determined value) | 67.7% | 4.1% | 13.4% |

The infrared absorption spectrum of this oxadiazole derivative according to the KBr disk method is shown in FIG. 3. It was found that the glass transition temperature (Tg) of this oxadiazole derivative was 130° C. as measured by the differential scanning calorimetry. In visible-ultraviolet absorption spectrum, the wavelength of the absorption edge of this compound in 1,4-dioxane coincides with that of the starting material, 5-(2-aminophenyl)-2-(3-methoxyphenyl)-1,3,4-oxadiazole. No shift toward the longer wavelength side was observed.

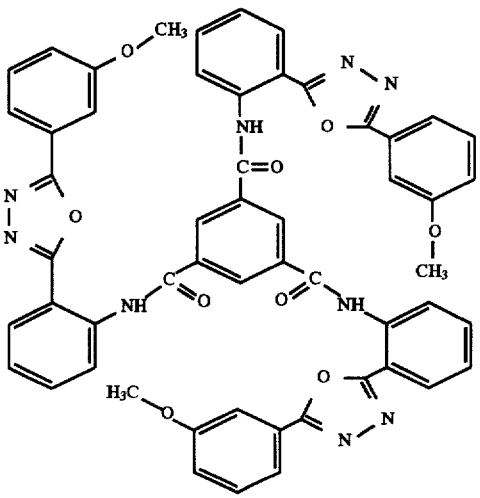

(3)

Synthesis example 2

Synthesis of Oxadiazole Derivative 2

1.0 g of cyanuric chloride and 5.0 g of 4-aminophenyl-phenyl-1,3,4-oxadiazole were reacted in DMSO for a week at 80° C. The reaction mixture was added to water, and then the generated precipitate was washed with water and methanol, and further recrystallized in ethanol, thereby obtaining 1.0 g of the oxadiazole derivative represented by the formula (4) in a pale yellowish powder form.

| Elemental analysis: $C_{45}H_{30}N_{12}O_3$ | | | |
|---|---|---|---|
| | Carbon | Hydrogen | Nitrogen |
| (Theoretical value) | 68.7% | 3.8% | 21.4% |
| (Determined value) | 67.5% | 3.4% | 20.8% |

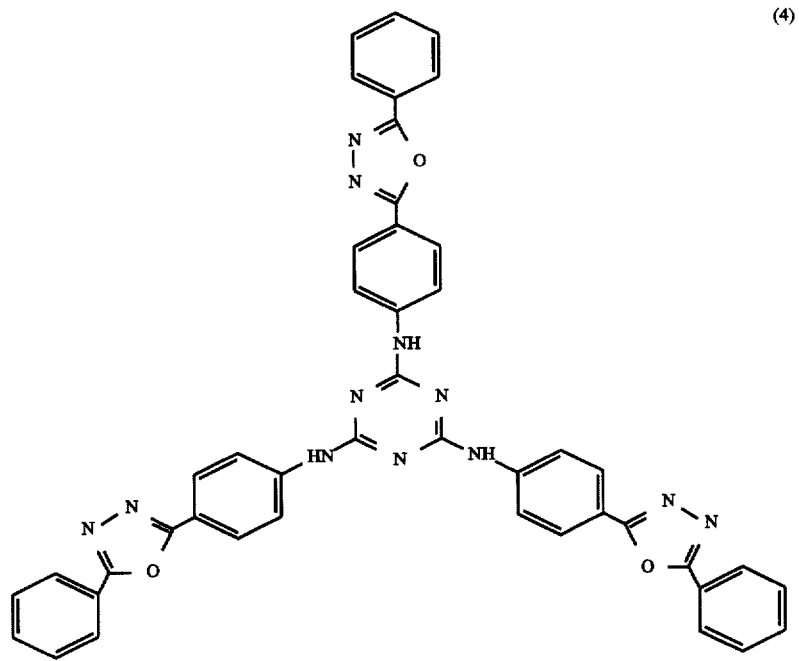

(4)

Synthesis example 3

Synthesis of a Carbazole Derivative 1.0 g of 1,3,5-benzenetricarboxylic trichloride and 2.2 g of N-aminocarbazole were reacted in dry pyridine for 5 hours at 80° C. The reaction mixture was added to 1000 ml of water, and then the generated precipitate was flitrated, and further washed well with methanol and warmed ethanol, thereby obtaining 1.3 g of the carbazole derivative represented by the following formula (5) in a yellowish powder form.

| Elemental analysis: $C_{45}H_{30}N_6O_3$ | | | |
|---|---|---|---|
| | Carbon | Hydrogen | Nitrogen |
| (Theoretical value) | 76.7% | 4.3% | 11.9% |
| (Determined value) | 76.0% | 4.0% | 11.0% |

Figure 4:
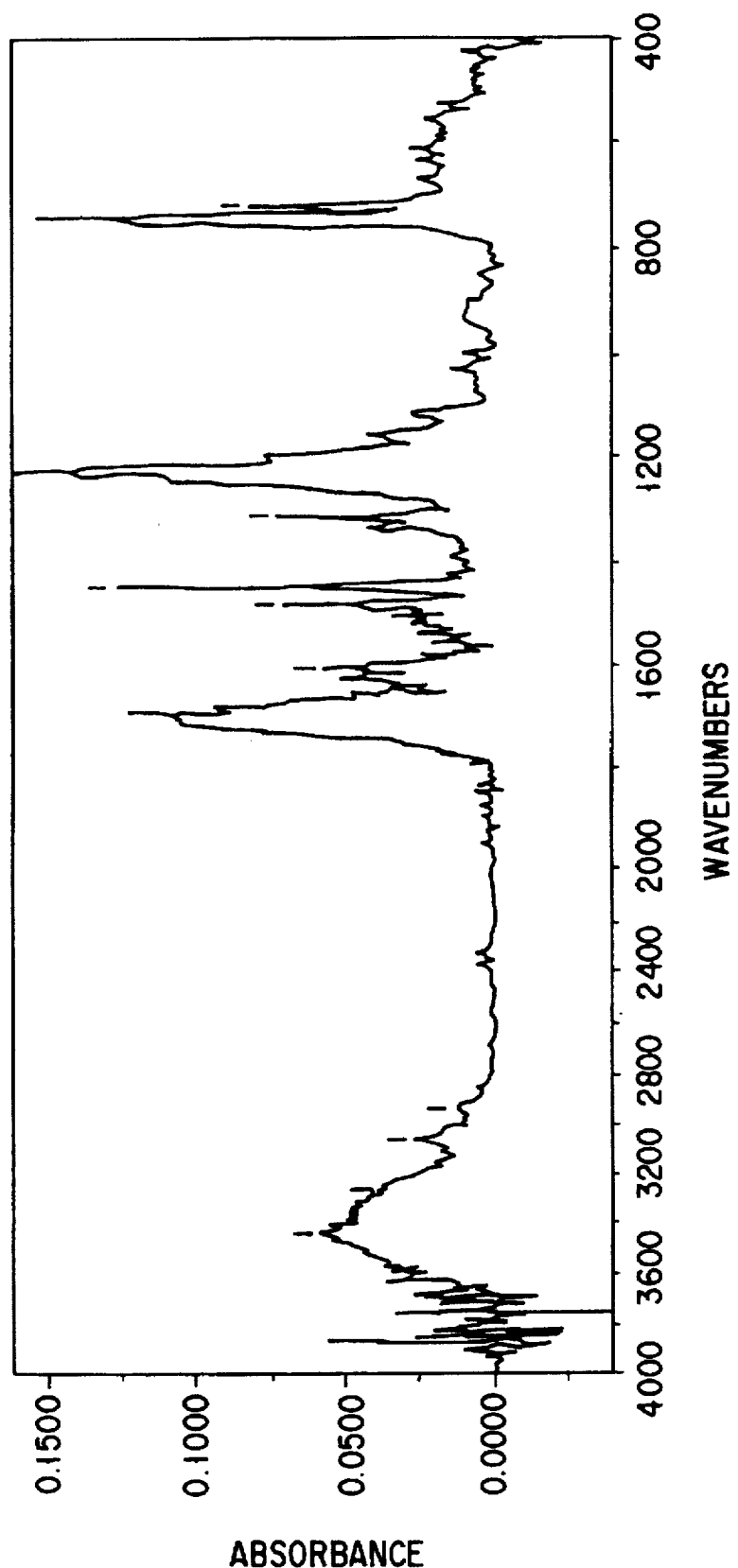
FIG. 4 is an infrared spectrum of a carbazole derivative represented by the formula (5), according to the KBr disk method.

The infrared absorption spectrum of this carbazole derivative according to the KBr disk method is shown in FIG. 4. It was found that the glass transition temperature (Tg) of this carbazole derivative was 230° C. as measured by the differential scanning calorimetry. In visible-ultraviolet absorption spectrum, the wavelength of the absorption edge of this compound in 1,4-dioxane almost coincides with that of the starting material, N-aminocarbazole. No shift toward the longer wavelength side was observed.

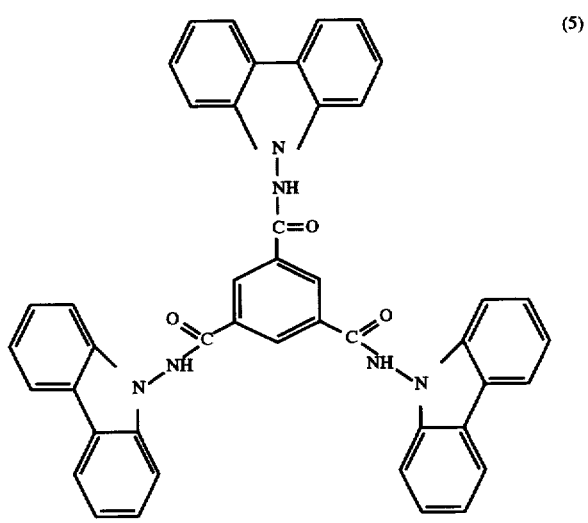

(5)

Synthesis example 4

Synthesis of a Naphthalene Derivative 1

1.0 g of cyanuric chloride and 4.0 g of 1,3-dimethylnaphthalene were reacted in the presence of aluminum chloride in carbon tetrachloride for a week at 80° C. The reaction mixture was added to cold diluted hydrochloric acid, and then the generated precipitate was washed with water and methanol, and further recrystallized in ethanol, thereby obtaining 1.0 g of the naphthalene derivative represented by the following formula (6) in a pale yellowish powder form.

|  | Elemental amlysis: $C_{39}H_{33}N_3$ | | |
|---|---|---|---|
|  | Carbon | Hydrogen | Nitrogen |
| (Theoretical value) | 86.2% | 6.1% | 7.7% |
| (Determined value) | 85.0% | 5.8% | 7.6% |

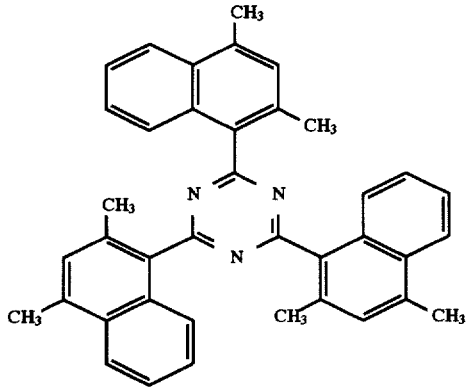

(6)

Synthesis example 5

Synthesis of a Naphthalene Derivative 2

1.0 g cyanuric chloride and 5.0 g of potassium salt of 2-hydroxynaphthalene were reacted in the presence of 18-crown-6 in DMSO for two days at 80° C. The reaction mixture was added to water, and then the generated precipitate was washed with water and methanol, and further recrystallized in ethanol, thereby obtaining 1.0 g of the naphthalene derivative represented by the formula (7) in a pale yellowish powder form.

|  | Elemental amlysis: $C_{33}H_{21}N_3O_3$ | | |
|---|---|---|---|
|  | Carbon | Hydrogen | Nitrogen |
| (Theoretical value) | 78.1% | 4.2% | 8.3% |
| (Determined value) | 78.0% | 3.9% | 7.8% |

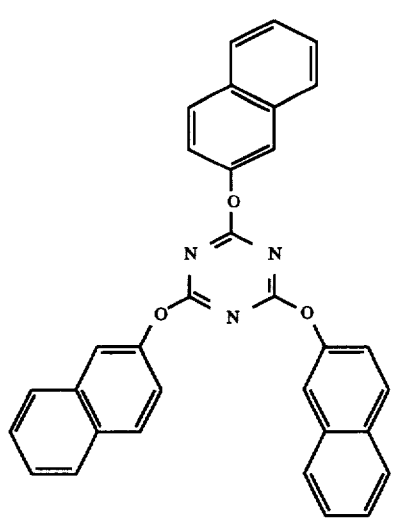

(7)

Example 1

Organic Electroluminescence Device

A carbazole derivative represented by the aforementioned formula (5) was vapor-deposited onto a glass substrate/ITO electrode at a thickness of 50 nm, thereby forming a hole-transport layer. On the hole-transport layer, pentaphenylcyclobutadiene was vapor-deposited at a thickness of 30 nm, thereby forming a luminescent layer. Further, on the luminescent layer, an oxadiazole derivative represented by the aforementioned formula (3) was vapor-deposited at a thickness of 50 nm, thereby forming an electron-transport layer. In this manner, an organic thin film layer having of a three layered structure was prepared. Finally, an aluminum electrode having an area of 1 cm$^2$ was formed on the obtained organic thin film layer, thereby manufacturing an organic electroluminescence device.

The initial luminance of the device was measured at a DC voltage of 10 V under a vacuum immediately after it was manufactured. The device exhibited a luminance of 500 cd/m$^2$. When the device was continuously driven until the initial luminance decreased by half, it required 10 days.

Example 2

Organic Electroluminescence Device

An organic electroluminescence device was manufacutred in the same manner as in Example 1 except that a triphenylamine derivative represented by the following formula (8) was used instead of a carbazole derivative represented by the aforementioned formula (5). Immediately after the device was manufactured, the initial luminance of the device was measured at a DC voltage of 10 V under a vacuum. The device exhibited a luminance of 700 cd/m$^2$, when the device was continuously driven until the initial luminance decreased by half, it required 9 days.

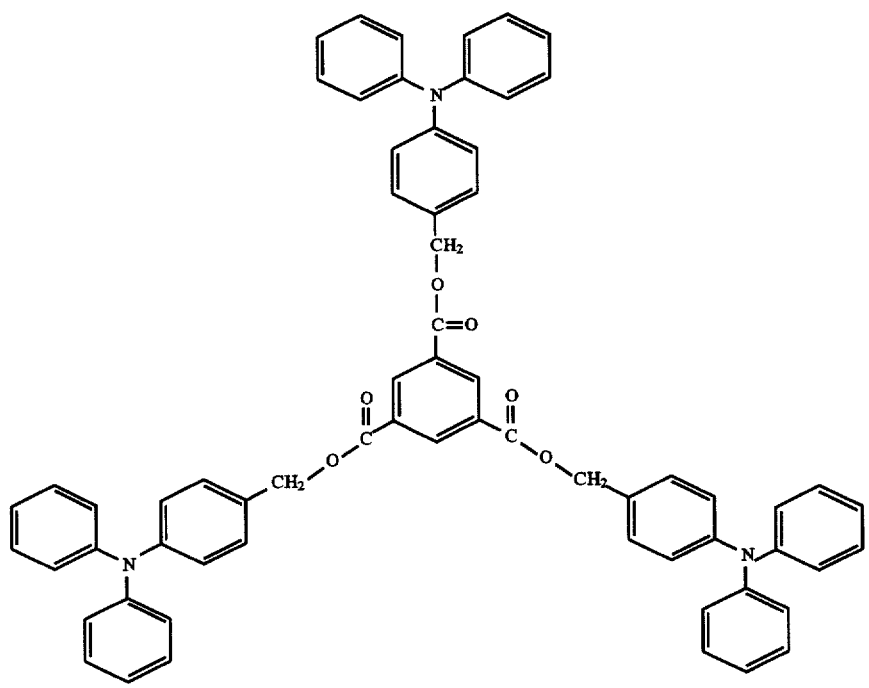

(8)

Example 3

Organic Solar Cell

A carbazole derivative represented by the aforementioned formula (5) was vapor-deposited onto a glass substrate/ITO electrode at a thickness of 50 nm, thereby forming a hole-transport layer. On this hole-transport layer, copper phthalocyanine was vapor-deposited at a thickness of 50 nm, thereby forming a charge-generation layer. Further, on the charge-generation layer, an oxadiazole derivate represented by the following formula (9) was vapor-deposited at a thickness of 50 nm, thereby forming an electron-tansport layer. In this manner, an organic thin film layer consisting of three-layered structure was prepared. Finally, three aluminum electrodes having an area of 1 cm$^2$ were formed on the obtained organic thin film layer, thereby manufacturing an organic solar cell.

Immediately after the cell was manufactured, the initial photoelectric conversion efficiency was measured by radiating light, from the glass substrate side, of a tungsten lamp from which ultraviolet rays of 400 nm or less were eliminated. As a result, each of three electrodes indicated a value in a range of 1.2 to 1.5%. When, the cell was continuously driven until the photoelectric conversion efficiency decreased by half, it required a half year.

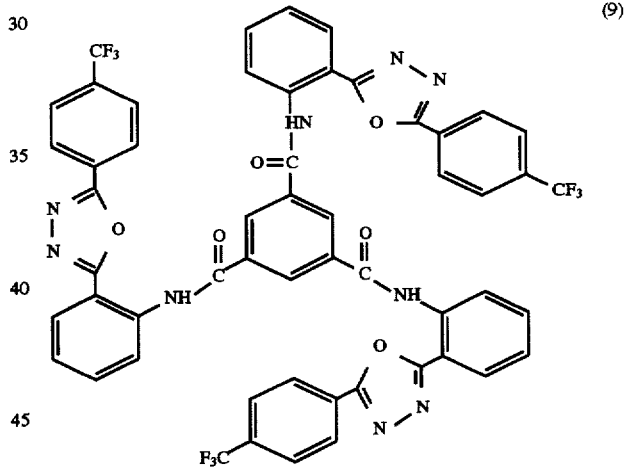

(9)

Example 4

Organic Photosensitive Body for Electrophotography

Onto an aluminum vapor-deposited film formed on the glass, a polycarbonate film was casted in which copper naphthalocyanine was dispersed in an amount of 30 wt %, thereby forming a coating film (charge-generation layer) of 2 μm in thickness. On this polycarbonate film, the coating film (hole-transport layer) of a polycarbonate having 2 μm in thickness was formed in which a triphenylamine derivative represented by the following formula (10) was dissolved in an amount of 30 wt %.

Immediately after the film was prepared, the film was charged to a surface potential of 700 V by means of corona discharge. Subsequently, attenuation of the surface charge potential of the resultant film was measured by radiating a monochromatic light having a wavelength of 630 nm and a power of 0.4 μW/cm$^2$. As a result, the film exhibited a high sensitivity of approximately 2 cm$^2$/μJ. Thereafter, the organic photosensitive body was left to stand for a half year at room temperature and subjected to the same measurement. As a result, no degradation caused by the storage was observed in the properties of the photosensitive body.

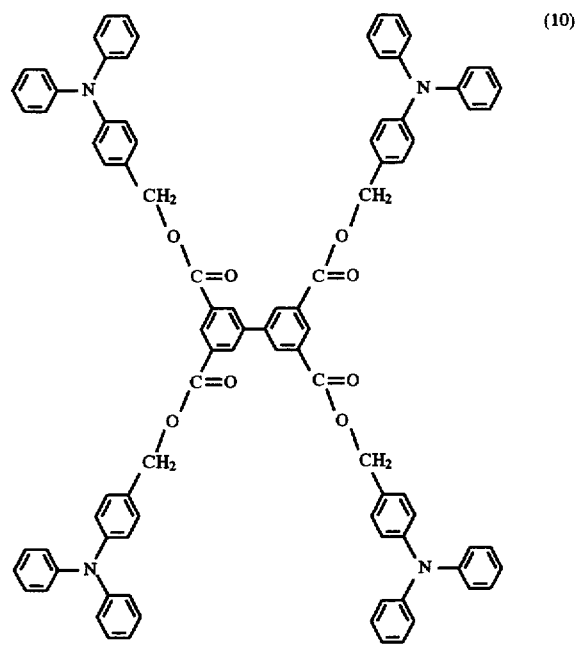

Example 5

Organic Rectifying Device

Onto an aluminum vapor-deposited electrode formed on the glass, the triphenylamine derivative represented by the aforementioned formula (8) was vapor-deposited, thereby forming a hole-transport layer. On this hole-transport layer, an oxadiazole derivative represented by the aforementioned formula (3) was vapor-deposited at a thickness of 20 nm, thereby forming an electron-transport layer. In this manner, organic thin film layer consisting of two-layered structure was prepared. Finally, an aluminum upper electrode having an area of 1 cm$^2$ was formed on the organic thin-film layer.

Immediately after the device was manufactured, the current-voltage characteristics of the resultant device were determined under a vacuum while light was being shielded. The device showed the rectification characteristics that a current was observed if the upper electrode was negative charged. Thereafter, the rectifying device was left to stand for a half year at room temperature and subjected to the same measurement. As a result, no degradation caused by the storage was observed in the properties.

Example 6

Optical Switching Device

Onto the aluminum substrate, a polycarbonate thin film of 10 µm in thickness was formed, containing a pyrene derivative represented by the following formula (11) in an amount of 30 wt %. To this thin film, ultraviolet rays were pattern-radiated to photo-oxidize the pyrene skeleton in air, thereby forming a branched optical path (waveguide) having a different refractive index from that of the surrounding region.

In the thus-obtained device, when a voltage was applied to one of branches of the aforementioned waveguide and change the refractive index thereof, it is possible to shift the length of the optical path by exactly half a wavelength and switch an output light on and off in accordance with the presence and absence of the voltage application. Thereafter, the optical switching device was left to stand for a half year at room temperature and subjected to the same measurement. As a result, no degradation caused by the storage was observed in the properties of the optical switching device.

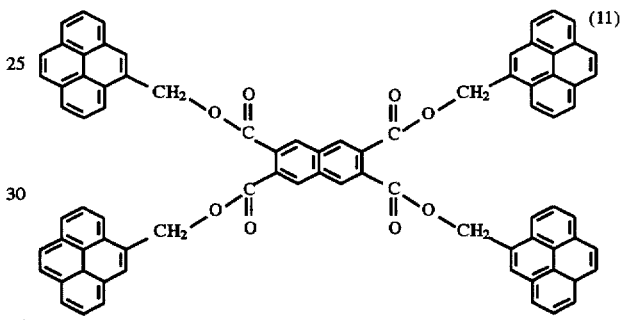

Example 7

Optical Disk

Onto a polycarbonate substrate, a chloroform solution of a pentacene derivative represented by the following formula (12) was spin-coated, thereby forming a thin film of 0.5 µm in thickness. The produced thin film had an amorphous structure. To this thin film, semiconductor laser beams having a wavelength of 630 nm and a power of 0.4 µW/cm$^2$ were radiated, in order to heat to crystallize very small spots, thereby effecting writing. As a reading out light, semiconductor laser beams of 630 nm in wavelength and 1 mW/cm$^2$ in power were radiated to the disk film, and the reflection light was measured. Since the intensity of the reflection light was increased 10 times or more by virtue of the crystallization, the record was able to be read out with a high sensitivity. After such a writing was repeated for 10$^4$ times, no change was observed.

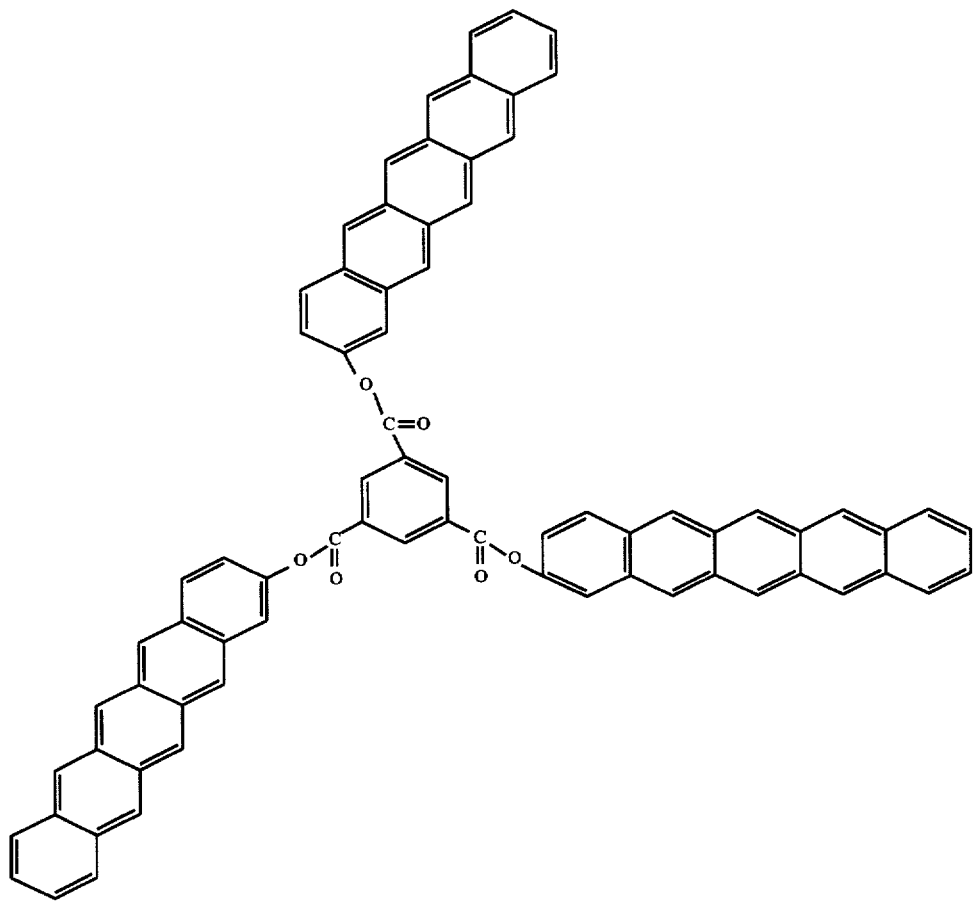

(12)

Example 8

Heat-resistant Transparent Organic-glass Film

An oxadiazole derivative (ultraviolet absorbing dye) represented by the aforementioned formula (3) was mixed in polycarbonate in an amount of 10 wt % based on the polycarbonate, and then, melt-molded to provide a transparent polycarbonate plate of 3 mm in thickness. The ultraviolet absorbing dye absorbs ultraviolet rays and converts the rays to heat or fluorescence of a long wavelength, thereby preventing degradation of a polymer caused by ultraviolet rays.

This polycarbonate plate was left to stand for a half year in air. As a result, no color staining was observed and degradation of the properties of the polycarbonate plate was rarely occurred.

Example 9

Color Filter

As red dye, a compound represented by the following formula (13) was mixed with a positive-working photoresist (manufactured by Tokyo Ohka Kogyo Co., Ltd.) in an amount of 50 wt % based on the positive-type photoresist. The mixture was spin-coated onto a glass substrate to form a coating layer of 5 μm in thickness. After ultraviolet rays were irradiated onto the coated glass substrate through a mask and the irradiated portion of the substrate was cured, non-exposed portion was washed off with a solvent. Second, as blue dye, a compound represented by the following formula (14) was mixed with the positive-working photoresist (manufactured by Tokyo Ohka Kogyo Co., Ltd.) in an amount of 50 wt % in a similar manner. This mixture was spin-coated onto the glass substrate. After ultraviolet rays were irradiated onto the coated glass substrate through a mask and the irradiated portion of the substrate was cured, non-exposed portion was washed off with a solvent. Subsequently, as a green dye, a compound represented by the following formula (15) was mixed with the positive-working photoresist (manufactured by Tokyo Ohka Kogyo Co., Ltd.) in an amount of 50 wt % in a similar manner. The mixture was spin-coated onto the glass substrate. After ultraviolet rays were irradiated onto the coated glass substrate through a mask, the irradiated portion of the substrate was cured, non-exposed portion was washed off with a solvent. Finally, a transparent thermosetting resin containing no dyes was coated on the resultant glass substrate and heated it up, thereby manufacturing a color filter. When this color filter was left to stand for two hours in air at 200° C., no degradation such as color-fading was observed.

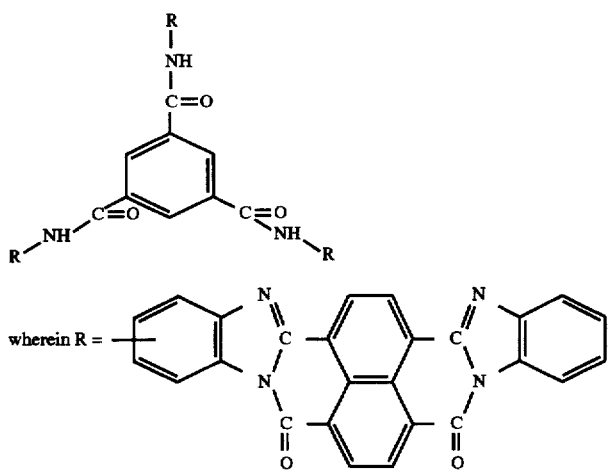

(13)

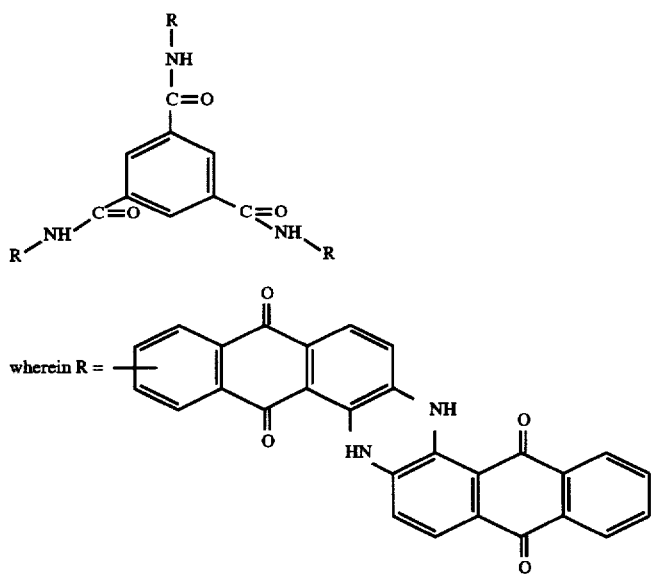

(14)

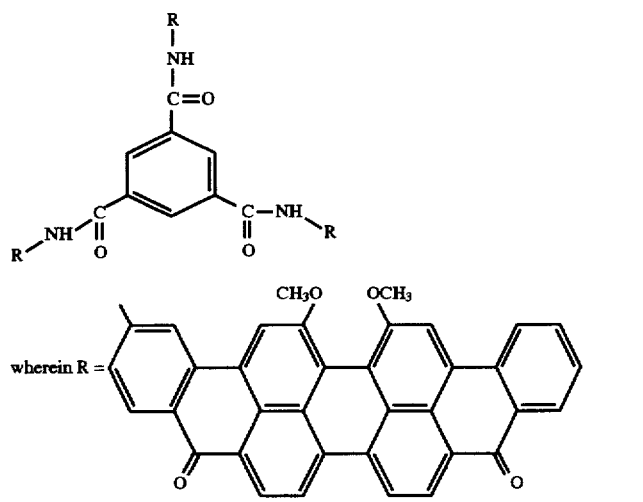

(15)

Example 10

PHB Optical Memory

A porphyrin derivative represented by the following formula (16) and triethoxysilane having an amount 100 times as high as that of the porphyrin derivative were dissolved in a mixed solvent of chloroform and ethanol. To the mixture, a small amount of diluted hydrochloric acid was added and the mixture was heated, thereby obtaining a sol. This mixture was casted onto a quartz substrate to form a film of 10

μm in thickness. The obtained thin film was heated under a vacuum at 150° C., thereby obtaining an amorphous inorganic composition.

To this thin film, dye laser beams of 645 nm in wavelength were radiated for 30 seconds with a power of 30 μW/cm$^2$ in a liquid nitrogen. As a result, holes were generated in a Q1 band of porphyrin. The half life of the generated holes was a half year.

formula (7) was used instead of a naphthalene derivative represented by the aforementioned formula (6). Further, the same measurement as in Example 1 was carried out. The device exhibited an initial luminance of 500 cd/m$^2$. It took 9 days to reduce the luminance by half.

Example 13

Organic Electroluminescence Device

An organic electroluminescence device was manufactured in the same manner as in Example 11 except that an

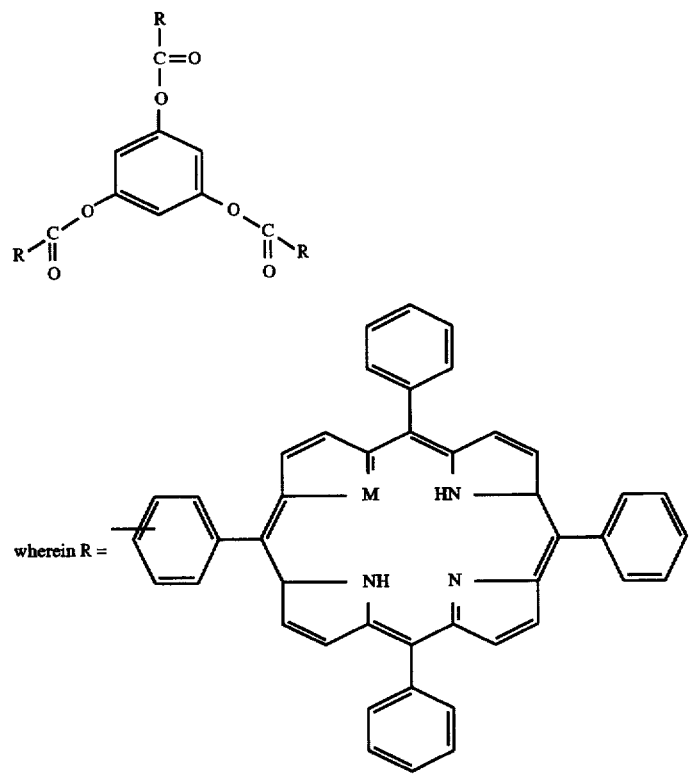

(16)

Example 11

Organic Electroluminescence Device

An organic electroluminescence device was manufactured in the same manner as in Example 1 except that electron-transport layer was formed using a naphthalene derivative represented by the aforementioned formula (6) instead of an oxadiazole derivative represented by the aforementioned formula (3). Further, the same measurement as in Example 1 was carried out. The device exhibited an initial luminance of 800 cd/m$^2$. It took 10 days to decrease the luminance by half.

Example 12

Organic Electroluminescence Device

An organic electroluminescence device was manufactured in the same manner as in Example 11 except that a naphthalene derivative represented by the aforementioned oxadiazole derivative represented by the aforementioned formula (4) was used instead of a naphthalene derivative represented by the aforementioned formula (6). Further, the same measurement as in Example 1 was carried out. The device exhibited an initial luminance of 700 cd/m$^2$. It took 10 days to decrease the luminance by half.

Example 14

Organic Electroluminescence Device

An organic electroluminescence device was manufactured in the same manner as in Example 1 except that a triphenylamine derivative represented by the following formula (17) was used instead of a carbazole derivative represented by the aforementioned formula (5). Further, the same measurement as in Example 1 was carried out. The device exhibited an initial luminance of 600 cd/m$^2$. It took 10 days to reduce the luminance by half.

(17)

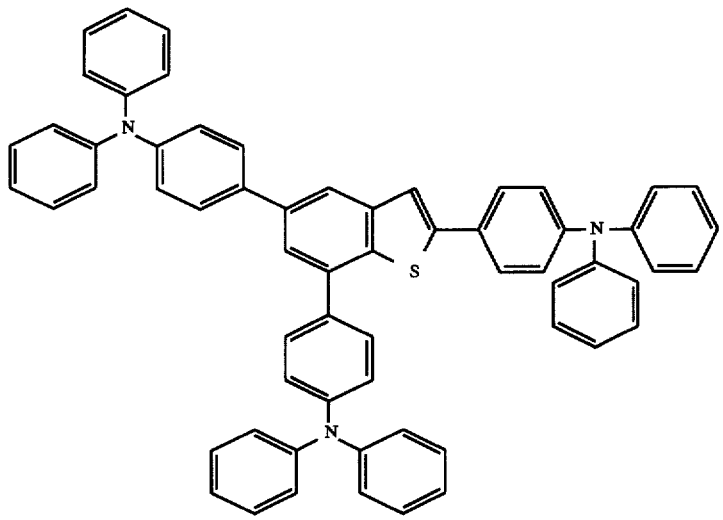

Example 15

Organic Solar Cell

An organic solar cell was prepared in the same manner as in Example 3 except that a naphthalene derivative represented by the aforementioned formula (6) was used instead of an oxadiazole derivative represented by the aforementioned formula (9). Further the same measurement as Example 3 was carried out. The cell exhibits an initial photoelectric conversion efficiency of 1.2 to 1.5%. It took a half year to decrease the photoelectric conversion efficiency by half.

Example 16

Organic Photosensitive Body for Electrophotography

Onto aluminum vapor-deposited electrode formed on the glass, a polycarbonate film in which copper phthalocyanine was dispersed in an amount of 30 wt %, was casted to form a coating film of 2 μm in thickness, thereby forming a charge-generation layer. On the charge-generation layer, a polycarbonate coating film of 2 μm in thickness was formed in which a triphenylamine derivative represented by the aforementioned formula (17) was dissolved in an amount of 30 wt %, thereby forming a hole-transport layer.

Immediately after the film was prepared, the film was charged to 500 V of a surface potential by means of corona discharge. Subsequently, attenuation of the surface charge potential of the resultant film was measured by radiating a monochromatic light having a wavelength of 630 nm and a power of 0.4 μW/cm². As a result, the film exhibited approximately 2 cm²/μJ. From this result, it was found that organic photosensitive body was obtained whose sensitivity was higher than that obtained in Example 4. Thereafter, the organic photosensitive body was left to stand for a half year at romm temperature and subjected to the same measurement. As a result, no degradation caused by the storage was observed in the properties of the photosensitive body.

Example 17

Organic Rectifying Device

An organic rectifying device was prepared in the same manner as in Example 5 except that a triphenylamine derivative represented by the aforementioned formula (17) was used instead of that represented by the aforementioned formula (8) and an oxadizole derivative represented by the aforementioned formula (4) was used instead of that represented by aforementioned formula (3).

Immediately after the device was manufactured, the current-voltage characteristics of the resultant device were determined under a vacuum while light was being shielded. The device showed the rectification characteristics that a current was observed if the upper electrode was negatively charge. Thereafter, the organic rectifying device was left to stand for a half year at room temperature and subjected to the same measurement. As a result, no degradation caused by storage was observed in its properties.

Example 18

Heat-resistant Transparent Organic-glass Film

A transparent polycarbonate plate was prepared in the same manner as in Example 8 except that the oxadiazole derivative represented by the aforementioned formula (4) was used instead of that represented by the aforementioned formula (3). In this case, the ultraviolet absorbing dye absorbs ultraviolet rays and converts the rays to heat or fluorescence of long wavelength, thereby preventing degradation of a polymer caused by ultraviolet rays.

The oxadiazole derivative represented by the formula (4) can reduce the LUMO level and is expected to suppress the electron transport in the polymer, thereby further preventing its degradation. This polycarbonate plate was left to stand for a year in air. As a result, no color staining was observed and degradation of the properties of the polycarbonate plate rarely occurred.

Example 19

PHB Optical Memory

An amorphous inorganic composition was prepared in the same manner as in Example 9 except that a porphyrin derivative represented by the following formula (18) was used instead of that represented by a formula (16).

To this film, dye laser beams were radiated. As a result, holes were efficiently generated in a Q1 band of porphyrin. The half life of the generated holes was a half year.

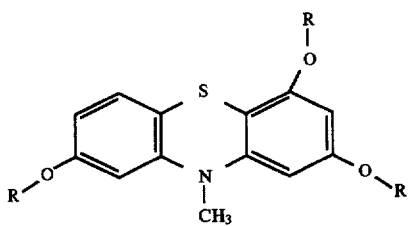

wherein R is the same as (13)

Comparative Example 1

The wavelength of the absorption edge of the compound whose oxadiazole skeleton was directly bound to a central benzene skeleton represented by the following formula (19), was 325 nm. A shift to the longer wavelength side was observed in this compound, compared to 310 nm of the wavelength of the absorption edge of a monomer represented by the following formula (20). In the wavelength of the absorption peak, the shift to the longer wavelength side by 25 nm was observed.

Example 1 was carried out. As a result, an initial luminance of this device was only 300 cd/m².

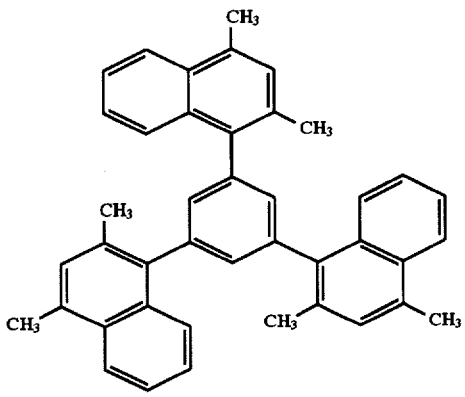

Comparative Example 3

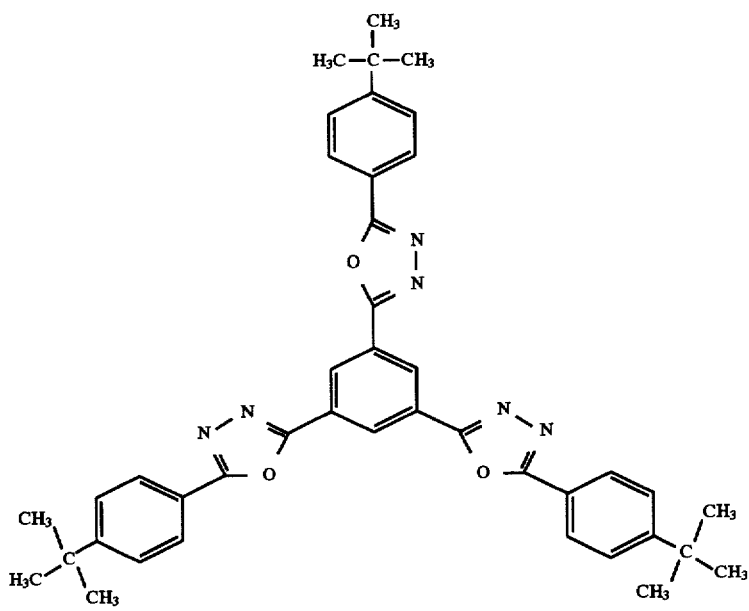

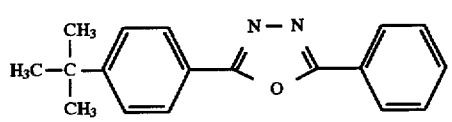

Comparative Example 2

Organic Electroluminescence Device

An organic electroluminescence device was manufactured prepared in the same manner as in Example 11 except that a naphthalene derivative represented by the following formula (21) was used instead of that represented by the aforementioned formula (6). The same measurement as in Heat Resistant Transparent Organic Glass Film A transparent polycarbonate plate was prepared in the same manner as in Example 18 except that an oxadiazole derivative represented by the following formula (22) was used instead of that represented by the aforementioned formula (4). This polycarbonate plate was left to stand for a year in air. As a result, color staining due to degradation was observed.

(22)

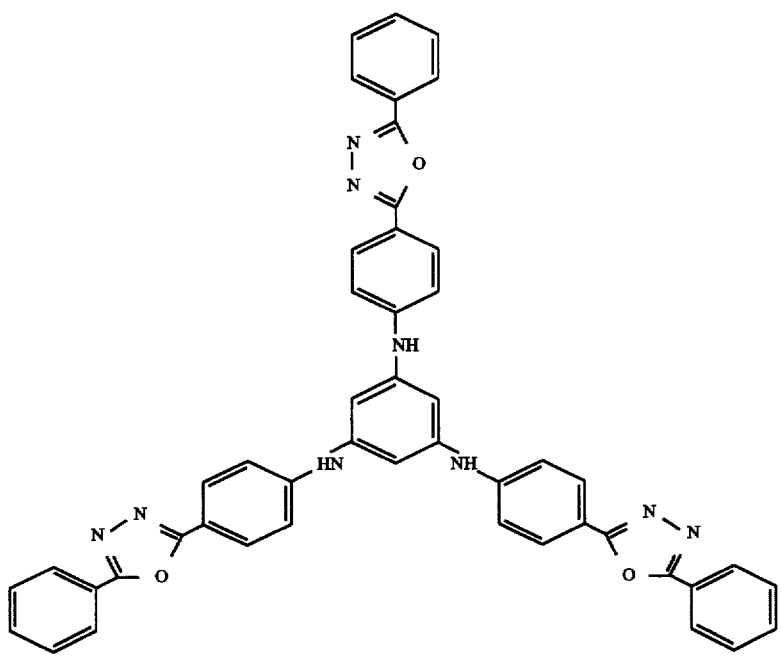

What is claimed is:

1. An amorphous organic thin-film device comprising an organic thin film containing a dye molecule, wherein said dye molecule has a molecular structure having an aromatic skeleton and three or more dye skeletons, and wherein said dye molecule is represented by the following formula (1)

R-(X-Y)$_n$ (1)

wherein R represents an aromatic skeleton; X represents a linkage group, containing a chemical bond formed by a condensation reaction, selected from the group consisting of an ester linkage, an amide linkage, a urethane linkage, a carbonate linkage, a thioester linkage, a urea linkage, a thiourea linkage, a hydrazone linkage, a carbamate linkage and a thioether linkage; Y represents a dye skeleton with or without a substituent; and n is an integer of 3 or more, in which n members of X and Y may be the same or different, said linkage X preventing the expansion of π-bonding between the n-system of the aromatic skeleton R and the π-system of a dye skeleton Y.

2. The amorphous organic thin-film device according to claim 1, wherein said aromatic skeleton is selected from the group consisting of a benzene ring, a biphenyl ring, a condensed ring and a heterocyclic ring.

3. The amorphous organic thin-film device according to claim 1, wherein said chemical bond formed by a condensation reaction, is selected from the group consisting of an amide linkage, an urethane linkage, a urea linkage and a thiourea linkage, which can generate a hydrogen bond.

4. The amorphous organic thin-film device according to claim 1, wherein at least one of said three or more dye skeletons has a substituent which can generate a hydrogen bond.

5. The amorphous organic thin-film device according to claim 4, wherein said substituent which can generate a hydrogen bond is selected from the group consisting of a hydroxyl group, a carboxyl group, an amido group, an amino group, a urethane group and a urea group.

6. The amorphous organic thin-film device according to claim 1, wherein three dye skeletons bind to 1-, 3-, and 5-positions of a benzene ring via chemical bonds formed by a condensation reaction.

7. The amorphous organic thin-film device according to claim 1, wherein four dye skeletons bind to 3-, 3'-, 5-, and 5'-positions of a biphenyl ring via chemical bonds formed by a condensation reaction.

8. An amorphous organic thin-film device comprising an organic thin film containing a dye molecule, wherein said dye molecule has a molecular structure having an aromatic skeleton and three or more dye skeletons, and wherein said dye molecule is represented by the following formula (1)

R-(X-Y)$_n$ (1)

wherein R represents an aromatic skeleton; X represents a linkage group, containing a chemical bond formed by a condensation reaction, selected from the group consisting of an ester linkage, a urethane linkage, a carbonate linkage, a thioester linkage, a urea linkage, a thiourea linkage; a hydrazone linkage, a carbamate linkage and a thioether linkage; Y represents a dye skeleton with or without a substituent; and n is an integer of 3 or more, in which n members of X and Y may be the same or different, said linkage X preventing the expansion of π-bonding between the π-system of the aromatic skeleton R and the π-system of a dye skeleton Y.

9. An amorphous organic thin-film device comprising an organic thin film containing a dye molecule, wherein said dye molecule has a molecular structure having an aromatic skeleton and three or more dye skeletons, and wherein said dye molecule is represented by the following formula (1)

R-(X-Y)$_n$ (1)

wherein R represents an aromatic skeleton; X represents a linkage group, containing a chemical bond formed by a condensation reaction, selected from the group consisting of an ester linkage, an amide linkage, a urethane linkage, a carbonate linkage, a thioester linkage, a urea linkage, a thiourea linkage, a hydrazone linkage, a carbamate linkage and a thioether linkage; Y represents a dye skeleton with or without a substituent selected from the group consisting of (i) Fulvalenes of the formulae:

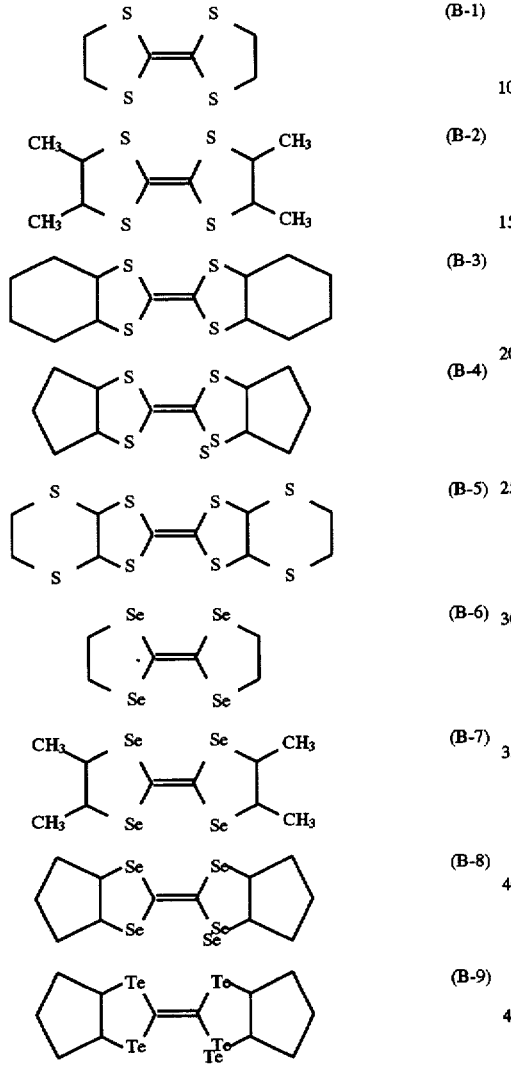

(ii) Heterocyclic compounds containing an ion of the formulae:

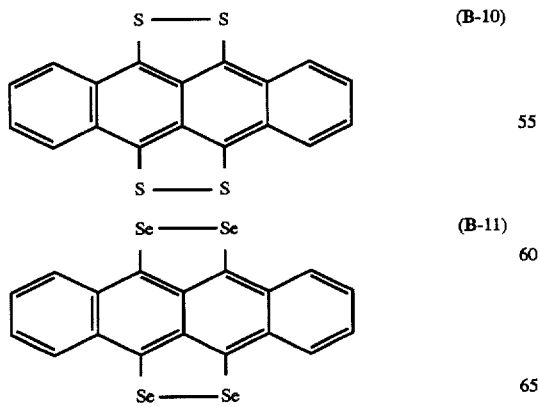

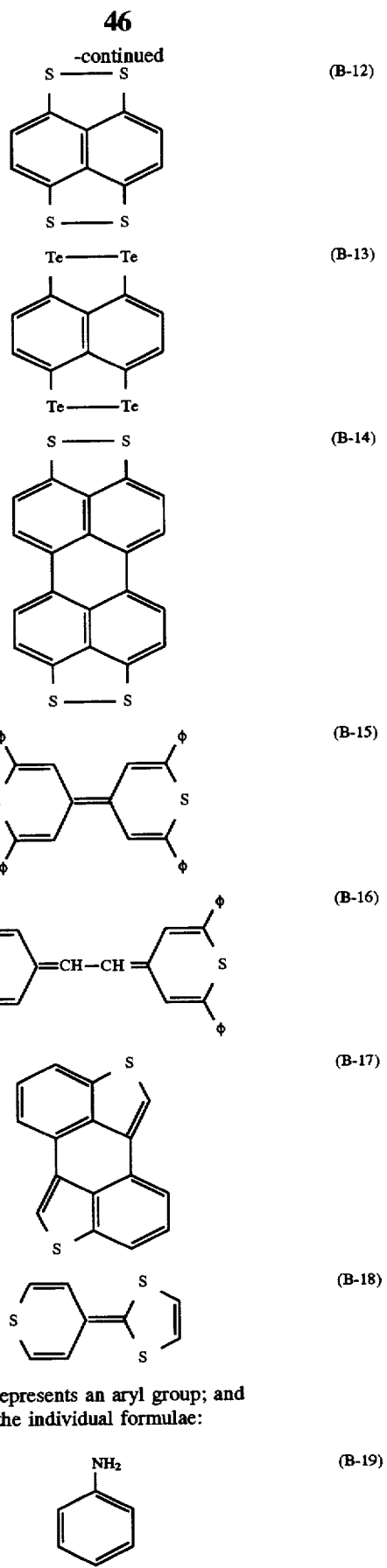

wherein Φ represents an aryl group; and (iii) others of the individual formulae:

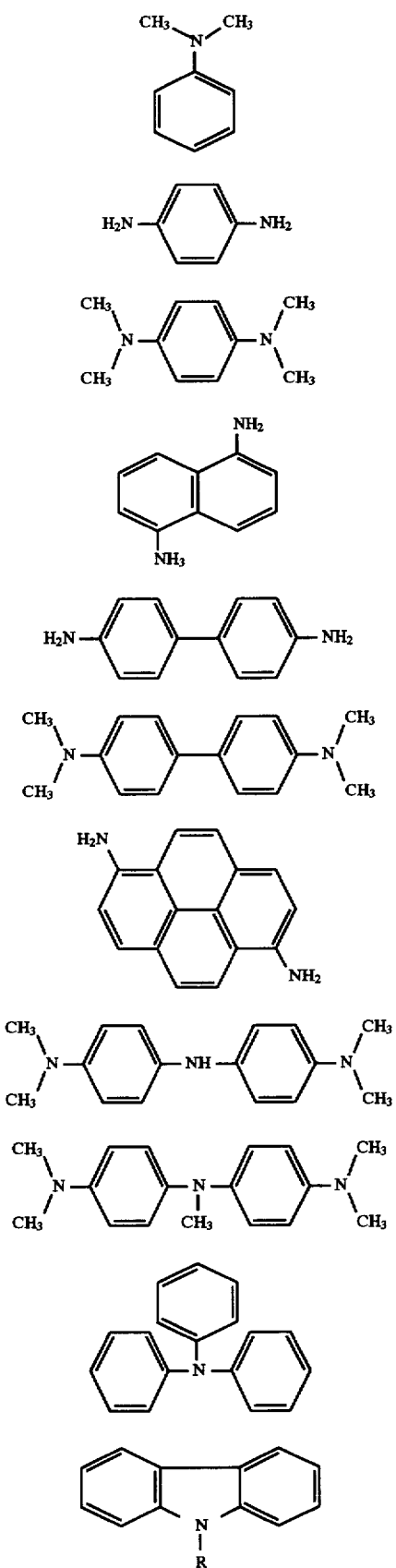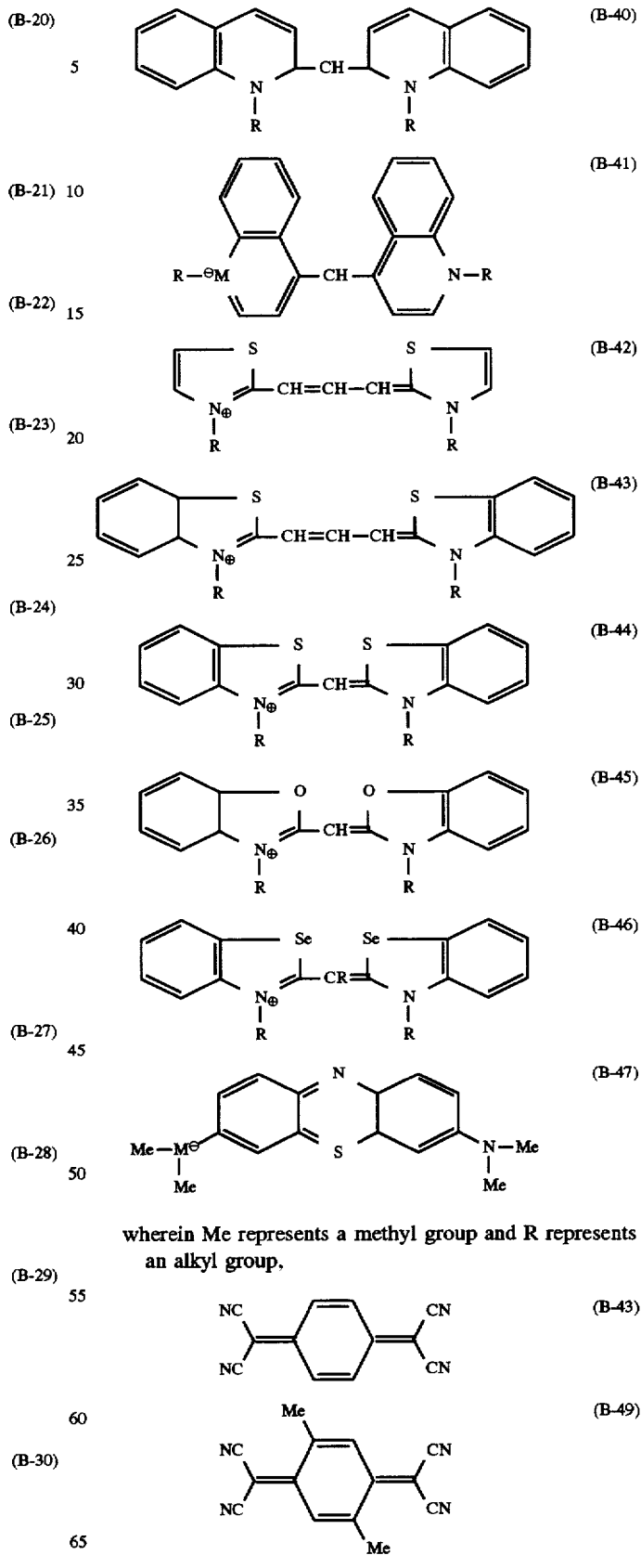
wherein R represents hydrogen or an alkyl group,
wherein Me represents a methyl group and R represents an alkyl group, -continued
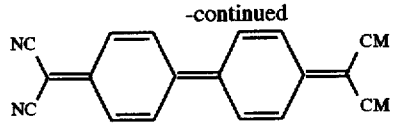 (B-50)
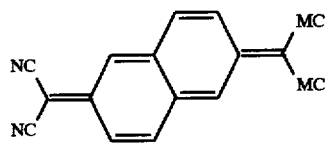 (B-51)
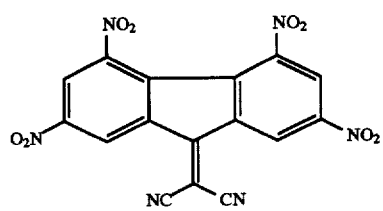 (B-52)
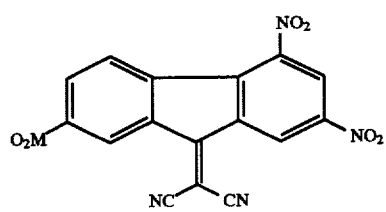 (B-53)
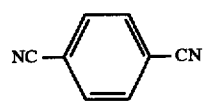 (B-54)
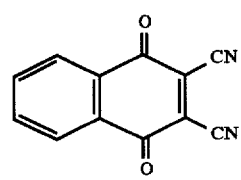 (B-55)
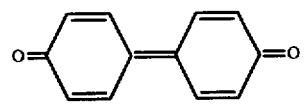 (B-56)
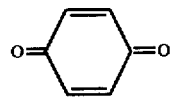 (B-57)
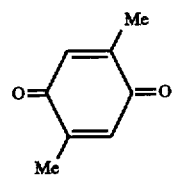 (B-58)
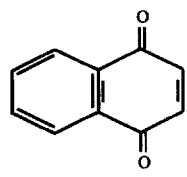 (B-59)
-continued
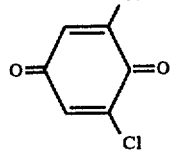 (B-60)
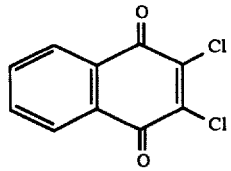 (B-61)
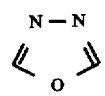 (B-67)
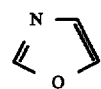 (B-68)
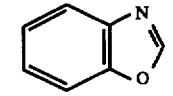 (B-69)
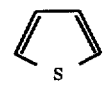 (B-70)
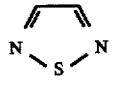 (B-71)
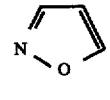 (B-72)
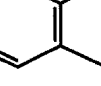 (B-73)
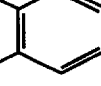 (B-74)
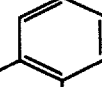 (B-75)
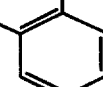 (B-75)
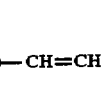 (B-76)
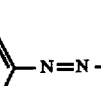 (B-77)

-continued
(B-78)
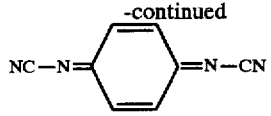
(B-79)
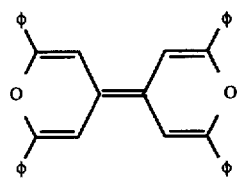
wherein φ represents an aryl group; and
n is an integer of 3 or more, in which n members of X and Y may be the same or different, said linkage X preventing the expansion of the π-bonding between the π-system of the aromatic skeleton R and the π-system of a dye skeleton Y.
* * * * *